(12) United States Patent
Hirakata et al.

(10) Patent No.: US 7,452,828 B2
(45) Date of Patent: Nov. 18, 2008

(54) CARBON NANOTUBE DEVICE, METHOD OF MANUFACTURING THE SAME, AND CARBON NANOTUBE TRANSFER BODY

(75) Inventors: Masaki Hirakata, Nakai-machi (JP); Takashi Isozaki, Nakai-machi (JP); Kentaro Kishi, Nakai-machi (JP); Taishi Shigematsu, Nakai-machi (JP); Chikara Manabe, Nakai-machi (JP); Kazunori Anazawa, Nakai-machi (JP); Hiroyuki Watanabe, Nakai-machi (JP); Masaaki Shimizu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 433 days.

(21) Appl. No.: 10/541,213

(22) PCT Filed: Oct. 27, 2003

(86) PCT No.: PCT/JP03/13725

§ 371 (c)(1),
(2), (4) Date: Jun. 30, 2005

(87) PCT Pub. No.: WO2004/106223

PCT Pub. Date: Dec. 9, 2004

(65) Prior Publication Data

US 2006/0038299 A1     Feb. 23, 2006

(30) Foreign Application Priority Data

May 30, 2003   (JP)   ............... 2003-155416

(51) Int. Cl.
*H01L 21/31* (2006.01)
*H01L 21/469* (2006.01)

(52) U.S. Cl. ............. 438/780; 977/721; 977/726; 977/742; 977/749; 257/E51.04

(58) Field of Classification Search ............... 438/149, 438/237, 328, 949, 780; 977/721, 726, 742, 977/749; 257/E51.04
See application file for complete search history.

(56) References Cited

U.S. PATENT DOCUMENTS 6,342,276 B1    1/2002   You (Continued)

FOREIGN PATENT DOCUMENTS

| | | |
|---|---|---|
| EP | 1 020 888 A1 | 7/2000 |
| EP | 1 096 533 A1 | 8/2000 |
| JP | A 2002-190247 | 7/2002 |

(Continued)

OTHER PUBLICATIONS

Tsukakoshi et al., "Fundamentals of Conductive Characteristics of Multiwall Carbon Nanotube," *Applied Physics*, vol. 72, pp. 333-337 {2003} w/ Appendix.

(Continued)

*Primary Examiner*—Michelle Estrada
(74) *Attorney, Agent, or Firm*—Oliff & Berridge, PLC

(57) ABSTRACT

To provide a carbon nanotube device capable of efficiently exerting various electrical or physical characteristics of a carbon nanotube, the present invention provides: a carbon nanotube device, in which a carbon nanotube structure layer having a network structure in which plural carbon nanotubes mutually cross-link, is formed in an arbitrary pattern on a surface of a base body; and a method of manufacturing the carbon nanotube device with which the carbon nanotube can be suitably manufactured.

19 Claims, 9 Drawing Sheets

U.S. PATENT DOCUMENTS

| | | | |
|---|---|---|---|
| 6,899,945 B2 * | 5/2005 | Smalley et al. | ............ 428/314.8 |
| 2002/0122765 A1 | 9/2002 | Horiuchi et al. | |
| 2002/0172639 A1 | 11/2002 | Horiuchi et al. | |
| 2003/0211028 A1 * | 11/2003 | Smalley et al. | ............ 423/447.1 |

FOREIGN PATENT DOCUMENTS

| | | |
|---|---|---|
| JP | A-2002-234000 | 8/2002 |
| WO | WO 01/07694 A1 | 2/2001 |
| WO | WO 01/20402 A1 | 3/2001 |
| WO | WO 02/16257 A2 | 2/2002 |

OTHER PUBLICATIONS

Dai et al., "Controlled Chemical Routes to Nanotube Architectures, Physics, and Devices," *J. Phys. Chem.*, vol. 103, pp. 11246-11255 {1999}.

Cassell et al., "Directed Growth of Free-Standing Single-Walled Carbon Nanotubes," *J. Am. Chem. Soc.*, vol. 121, pp. 7975-7976 {1999}.

Snow et al., "Random Networks of Carbon Nanotubes as an Electronic Material," *Applied Physics Letters*, vol. 82, No. 13, pp. 2145-2147 {Mar. 31, 2003}.

Lyubchenko et al., "Atomic Force Microscopy of DNA and Bacteriophage in Air, Water and Propanol: The Role of Adhesion Forces," *Nucleic Acids Research*, vol. 21, No. 5, pp. 1117-1123 {1993}.

Walt A. de Hecr et al., "Aligned Carbon Nanotube Films: Production and Optical and Electronic Properties," Science, vol. 268, May 12, 1995; XP 000574819.

* cited by examiner

REACTION SCHEME FOR INTRODUCING CARBOXYL GROUP INTO CARBON NANOTUBE

SCHEME FOR METHYL ESTERIFICATION REACTION OF CARBON NANOTUBE CARBOXYLIC ACID

SCHEME FOR POLYMERIZATION REACTION BETWEEN
CARBON NANOTUBE CARBOXYLIC ACID METHYL ESTER AND GLYCERIN BY ESTER EXCHANGE magnification ×2,500

CARBON NANOTUBE DEVICE, METHOD OF MANUFACTURING THE SAME, AND CARBON NANOTUBE TRANSFER BODY

TECHNICAL FIELD

The present invention relates to a carbon nanotube device useful for various electrical components and electrical elements or useful for various structures that utilize the toughness, thermal conductivity, and other characteristics of a carbon nanotube, a method of manufacturing the same, and to a carbon nanotube transfer body facilitating the manufacture of the carbon nanotube device. In particular, the present invention relates to a carbon nanotube device using carbon nanotubes for various electrical wirings or electrical components, the carbon nanotube device being extremely fine and excellent in electrical characteristics, a method of manufacturing the same, and to a carbon nanotube transfer body.

BACKGROUND ART

Carbon nanotubes (CNTs), with their unique shapes and characteristics, are being considered for various applications. A carbon nanotube has a tubular shape of one-dimensional nature which is obtained by rolling one or more graphene sheets composed of six-membered rings of carbon atoms into a tube. A carbon nanotube which is formed from one graphene sheet is called a single-wall nanotube (SWNT) while a carbon nanotube which is formed from plural graphene sheets is called a multi-wall nanotube (MWNT). SWNTs are about 1 nm in diameter, while multi-wall carbon nanotubes measure several tens nm in diameter, and both are far thinner than their predecessors, which are called carbon fibers.

One of the characteristics of carbon nanotubes resides in that the aspect ratio of length to diameter is very large since the length of carbon nanotubes is on the order of micrometers. Carbon nanotubes are unique in their extremely rare nature of being both metallic and semiconductive because six-membered rings of carbon atoms in carbon nanotubes are arranged into a spiral. In addition, the electric conductivity of carbon nanotubes is very high and allows a current flow at a current density of 100 $MA/cm^2$ or more.

Carbon nanotubes excel not only in electrical characteristics but also in mechanical characteristics. That is, the carbon nanotubes are distinctively tough, as attested by their Young's moduli exceeding 1 TPa, which belies their extreme lightness resulting from being formed solely of carbon atoms. In addition, the carbon nanotubes have high elasticity and resiliency resulting from their cage structure. Having such various and excellent characteristics, carbon nanotubes are very appealing as industrial materials.

Applied researches that exploit the excellent characteristics of carbon nanotubes have been heretofore made extensively. To give a few examples, a carbon nanotube is added as a resin reinforcer or as a conductive composite material while another research utilizes a carbon nanotube as a probe of a scanning probe microscope. Carbon nanotubes have also been utilized as minute electron sources, field emission electronic devices, and flat displays. An application that is being developed is to use a carbon nanotube as a hydrogen storage.

As described above, a carbon nanotube is expected to find use in various applications. In particular, applications thereof as electronic materials and electronic devices have been attracting attention. Electronic devices such as a diode and a transistor have been already prototyped, and are expected to replace current silicon semiconductors. In order to integrate such electronic devices using carbon nanotubes as those described above and to put the resultant into practical use, a wiring having a size of the order of $10^{-9}$ m (nm) is required. In general, metal is used as a current wiring material. However, there are physical limitations on the realization of a wiring having a size of the order of $10^{-9}$ m with a metal wiring.

In addition, the metal wiring involves a problem called migration. That is, metal wirings (gold, copper, aluminum, and the like) used in the current semiconductor devices each have a polycrystalline structure. In the structure, the orientation varies from crystal grain to crystal grain, so that a large number of defects are present at a grain boundary. Some of the metal atoms trapped in the defects have weak interatomic bonds. Owing to such structural factors, when a current density or a thermal stress acts while exceeding a certain tolerance, weakly bonded metal atoms start to move, and portions devoid of metal atoms (voids) form and grow. As a result, problems such as an increase in wiring resistance and disconnection occur (this phenomenon is referred to as "migration")

On the other hand, as described above, a carbon nanotube is structured by rolling a graphene sheet, and hence has no grain boundary. Therefore, the carbon nanotube is not considered to involve the occurrence of migration. In actuality, Kazuhito Tsukakoshi and Katsunobu Aoyagi, Applied Physics Vol. 72, p. 333 (2003) describes that a current of 0.4 mA can be caused to stably flow through a carbon nanotube having a diameter of 10 nm. The current value is 2 or more orders of magnitude larger than a migration tolerance for a copper wire. Therefore, it can be said that a carbon nanotube is an extremely promising material as a wiring material.

However, it is extremely difficult to actually wire carbon nanotubes. At present, several techniques of wiring carbon nanotubes have been attempted.

A first technique includes: picking up one or several carbon nanotubes by using a manipulator in a scanning electron microscope; and arranging the one or several carbon nanotubes at a desired position. A technique for arranging carbon nanotubes by using a probe microscope may be given as an example of a modification of the first technique. However, the technique requires much time and labor. Therefore, the technique is suitable for fundamental studies but is not practical.

A second technique is a technique for orienting a carbon nanotube in a certain direction by using electrophoresis. With this technique, carbon nanotubes may be wired in one direction, but it is difficult to wire carbon nanotubes in plural directions. Thus, this technique is not realistic.

A third technique is a technique employing a chemical vapor deposition (CVD) method. The CVD method includes: using an acetylene gas or methane gas containing carbon as a raw material; and producing a carbon nanotube by a chemical decomposition reaction of the raw material gas. H. Dai, J. Kong, C. Zhou, N. Franklin, T. Tombler, A. Cassell, S. Fan, M. Chapline, J. Phys. Chem. 103, p. 11246-11255 (1999) discloses a technique of generating a carbon nanotube by: forming a pattern of a catalyst metal necessary for generating a carbon nanotube on a porous silicon substrate according to a semiconductor process; and causing a raw material gas to flow through the pattern. However, in the method, a carbon nanotube grows only in the direction perpendicular to the substrate.

Cassell, N. Franklin, T. Tombler, E. Chan, J. Han, H. Dai, J. Am. Chem. Soc. 121, 7975-7976 (1999) discloses a method of wiring a carbon nanotube horizontally to a substrate. That is, disclosed is a technique including: fabricating an Si pillar on a substrate; mounting a catalyst on the top part of the pillar; and allowing a methane gas to flow to bridge a carbon nanotube between pillars. The method by this technique has certainly enabled horizontal wiring. However, the probability of cross-link is extremely low, and wiring at an arbitrary position is still difficult.

As described above, a technique for wiring one or several carbon nanotubes is still at a developmental stage.

In the meantime, a method for wiring or patterning using a carbon nanotube as a film has been developed. For example, pattern formation of a carbon nanotube has been heretofore performed by using a screen printing method or a photolithography technique. Each of those techniques is excellent in forming a pattern in a wide area at once, and is used for patterning of an electron source in a field emission type display (FED). However, in each of those methods, a carbon nanotube is merely dispersed in a solvent before application, or is mixed with a binder before application. Therefore, the carbon nanotube is insufficient in terms of performance such as a mechanical strength or electric conductivity, and is hardly used directly as an electrode or an electric circuit.

Patent Document 1 discloses that a carbon nanotube with a three-dimensional structure can be formed by using a functionalized carbon nanotube. However, this publication discloses that, for simple use in a chromatography-flow cell electrode, a product obtained by depositing onto a metal mesh a carbon nanotube to which a functional group that is porous and serves to separate and suck a passing substance has been bonded is made porous, or carbon nanotubes are bonded to each other by using an alkoxide of aluminum or silica (the alkoxide itself serves as an insulator) as a cross-linking agent.

In the former example in JP 2002-503204 A, a wiring or the like to be obtained is merely a deposit of carbon nanotubes, and its shape can only be an inner shape of a vessel. In addition, when one tries to process such a carbon nanotube deposit, carbon nanotubes scatter during the processing, so that the deposit cannot be processed into a desired shape.

On the other hand, in the latter example in JP 2002-503204 A, in the case where cross-linking is performed using an alkoxide, alkoxides together form a complicated cross-linking structure, so that it is difficult to densely arrange carbon nanotubes. Therefore, carbon nanotubes are isolated and dispersed into multiply entangled residues of alkoxides even though the carbon nanotubes are chemically bonded. For example, when aluminum tributoxide is used as a cross-linking agent, even if carbon nanotubes are bonded through one aluminum structural unit (—O—Al—O—), several of or several tens of aluminum structural units are bonded in a chain fashion at other portions. As a result, a distance between carbon nanotubes at a cross-linking portion of carbon nanotubes varies. Therefore, although characteristics are uniformized in a structure having an entirely large size, the lower the size of a structure, the larger the variations in characteristics. As a result, there is a possibility that problems such as a problem in that excellent characteristics of a carbon nanotube itself are obtained only accidentally occur. As described above, a carbon nanotube structure in which carbon nanotubes are cross-linked by using an alkoxide and bonded in a network fashion is not suitable for thinning and downsizing while characteristics that are unique of a carbon nanotube are exerted. In addition, not only electrical applications of the structure but also general applications thereof are restricted.

Therefore, an object of the present invention is to solve the above problems involved in the prior art. More specifically, an object of the present invention is to provide a carbon nanotube device capable of efficiently exerting various electrical or physical characteristics of a carbon nanotube, a method of manufacturing the same, and a carbon nanotube transfer body facilitating the manufacture of a carbon nanotube device. In particular, an object of the present invention is to provide a carbon nanotube device capable of arranging a metal wiring or electrical component which is fine and has an arbitrary shape on the surface of a base body such as a substrate, a method of manufacturing the same, and a carbon nanotube transfer body.

DISCLOSURE OF THE INVENTION

The above object can be achieved by the present invention to be described below. That is, according to the present invention, there is provided a carbon nanotube device, characterized by including: a base body; and a carbon nanotube structure layer having a network structure in which plural carbon nanotubes mutually cross-link, the carbon nanotube structure layer being formed in an arbitrary pattern on the surface of the base body at least.

In the carbon nanotube device of the present invention, the carbon nanotube structure layer having a network structure in which plural carbon nanotubes mutually cross-link through plural cross-linked sites is formed in an arbitrary pattern on the surface of the base body. Thus, contact or arrangement of carbon nanotubes is not unstable, unlike a mere carbon nanotube dispersion film. Therefore, there are stably obtained characteristics that are unique of carbon nanotubes, including: electrical characteristics such as high electron- and hole-transmission characteristics; physical characteristics such as thermal conductivity and toughness; and light absorption characteristics.

Here, carbon nanotube devices refer to the whole devices utilizing characteristics of carbon nanotubes. For example, the carbon nanotube devices include electrical and electronic devices utilizing electrical characteristics, mechanical devices utilizing mechanical characteristics, optical devices utilizing light absorption characteristics, and further, structures utilizing physical characteristics.

It is preferable that the carbon nanotube structure layer be obtained by: curing a solution containing carbon nanotubes having functional groups and a cross-linking agent which prompts a cross-linking reaction with the functional groups; and subjecting the functional groups of the carbon nanotubes and the cross-linking agent to a cross-linking reaction to form a cross-linked site. At this time, the cross-linking agent is preferably a not-self-polymerizable cross-linking agent.

When the carbon nanotube structure layer is formed through curing of a solution as described above, the cross-linked site where the carbon nanotubes mutually cross-link has a cross-linking structure in which residues of the functional group remaining after a cross-linking reaction are connected together with a connecting group, which is a residue of the cross-linking agent remaining after a cross-linking reaction.

When the cross-linking agent has a property in which the cross-linking agents may prompt a polymerization reaction with each other (self-polymerizability), the connecting group may contain a polymer in which two or more cross-linking agents are connected. An interval between carbon nanotubes can be controlled to a size of the residue of the cross-linking agent used, so that a desired network structure of carbon nanotubes can be obtained with high reproducibility. Furthermore, reducing the size of the residue of the cross-linking agent enables the interval between carbon nanotubes to be structured in such a manner that the carbon nanotubes are extremely close to each other both electrically and physically.

Therefore, if the cross-linking agent is not self-polymerizable, inherent electrical characteristics or physical characteristics of the carbon nanotubes can be exerted at an extremely high level.

In the present invention, the term "self-polymerizable" refers to a property in which the cross-linking agents may prompt a polymerization reaction with each other in the presence of other components such as water, or in the absence of other components. On the other hand, the term "not self-polymerizable" means that the cross-linking agent has no such a property.

If a cross-linking agent which is not self-polymerizable is selected as the cross-linking agent, a cross-linked site, where carbon nanotubes in an applied film of the present invention mutually cross-link, has primarily an identical cross-linking structure. Furthermore, the connecting group preferably employs a hydrocarbon as its skeleton, and the number of carbon atoms of the skeleton is preferably 2 to 10. Reducing the number of carbon atoms can shorten the length of the cross-linked site and sufficiently narrow a gap between carbon nanotubes as compared to the length of a carbon nanotube itself. As a result, a carbon nanotube structure layer of a network structure composed substantially only of carbon nanotubes can be obtained. Therefore, the entirety of the carbon nanotube structure layer can be allowed to efficiently exert characteristics of carbon nanotubes (electric conductivity, thermal conductivity, toughness, light absorption characteristics, and the like). Even when the carbon nanotube structure layer is processed into a predetermined shape, those characteristics can be effectively utilized with small variations.

Examples of the functional group include —OH, —COOH, —COOR (where R represents a substituted or unsubstituted hydrocarbon group), —COX (where X represents a halogen atom), —$NH_2$, and —NCO. A selection of at least one functional group selected from the group consisting of the above functional groups is preferable, and in such a case, a cross-linking agent, which may prompt a cross-linking reaction with the selected functional group, is selected as the cross-linking agent.

Further, examples of the preferable cross-linking agent include a polyol, a polyamine, a polycarboxylic acid, a polycarboxylate, a polycarboxylic acid halide, a polycarbodiimide, and a polyisocyanate. A selection of at least one cross-linking agent selected from the group consisting of the above cross-linking agents is preferable, and in such a case, a functional group, which may prompt a cross-linking reaction with the selected cross-linking agent, is selected as the functional group.

At least one functional group and one cross-linking agent are preferably selected respectively from the group exemplified as the preferable functional group and the group exemplified as the preferable cross-linking agent, so that a combination of the functional group and the cross-linking agent may prompt a cross-linking reaction with each other.

Examples of the particularly preferable functional group include —COOR (where R represents a substituted or unsubstituted hydrocarbon group). Introduction of a carboxyl group into carbon nanotubes is relatively easy, and the resultant substance (a carbon nanotube carboxylic acid) is highly reactive. Therefore, after the formation of the substance, it is relatively easy to esterify the substance to convert its functional group into —COOR (where R represents a substituted or unsubstituted hydrocarbon group), and such a functional group easily prompts a cross-linking reaction and is suitable for formation of an applied film.

A polyol can be exemplified as the cross-linking agent corresponding to the functional group. A polyol is cured by a reaction with —COOR (where R represents a substituted or unsubstituted hydrocarbon group), and forms a robust cross-linked substance with ease. Among polyols, each of glycerin and ethylene glycol reacts with the above functional groups well. Moreover, each of glycerin and ethylene glycol itself has high biodegradability, and applies a light load to an environment.

In the cross-linked site in which the plural carbon nanotubes mutually cross-link, the functional group is —COOR (where R represents a substituted or unsubstituted hydrocarbon group). The cross-linked site is —COO($CH_2$)$_2$OCO— in the case where ethylene glycol is used as the cross-linking agent. In the case where glycerin is used as the cross-linking agent, the cross-linked site is —COOCH$_2$CHOHCH$_2$OCO— or —COOCH$_2$CH(OCO—)CH$_2$OH if two OH groups contribute to the cross-linking, and the cross-linked site is —COOCH$_2$CH(OCO—)CH$_2$OCO— if three OH groups contribute to the cross-linking. The chemical structure of the cross-linked site may be any chemical structure selected from the group consisting of the above four structures.

The carbon nanotube device of the present invention can be used as various electrical components and electrical elements by allowing at least part of the arbitrary pattern to have a structure suitable for a desired purpose, for example, any one of the following structures (1) to (3).

(1) At least part of the arbitrary pattern can be a pattern constituting an electrical component. For example, a field-effect transistor can be obtained by turning the part of the arbitrary pattern into a pattern serving as a gate electrode of the field-effect transistor and constituting the other part thereof with a carbon nanotube or other members.

(2) At least part of the arbitrary pattern can be a pattern constituting an electric wiring. For example, various electrical devices can be obtained by obtaining a printed board as a pattern serving as a wiring of a specific electrical circuit and connecting plural carbon nanotubes or other electrical components to the surface of the carbon nanotube structure layer.

In the aspect of (2), the plural carbon nanotubes are preferably multi-wall carbon nanotubes having high electric conductivity characteristics for suppressing a resistance loss due to wiring.

The base body may have plasticity or flexibility. When the base body has plasticity or flexibility, the base body can be deformed before use according to how the carbon nanotube device of the present invention is used. At the same time, a device which hardly causes performance deterioration owing to disconnection involved in the deformation of the base body can be obtained, owing to the flexibility and toughness of a carbon nanotube.

In the present invention, the term "plasticity or flexibility" refers to a property in which a material changes its original shape through deflection, bending, or the like thereof. It is meaningless to clearly distinguish the term "plasticity" from the term "flexibility".

In the meantime, a method of manufacturing a carbon nanotube device of the present invention is characterized by including:

an applying step of applying to the surface of a base body a solution containing plural carbon nanotubes having functional groups and a cross-linking agent which prompts a cross-linking reaction with the functional groups;

a cross-linking step of mutually cross-linking the plural carbon nanotubes to construct a network structure through curing of the solution after the application to thereby form a carbon nanotube structure layer having the network structure; and a patterning step of patterning the carbon nanotube structure layer into a pattern corresponding to a desired device.

It has been conventionally impossible to pattern a structure aimed at providing an effect of an interaction between carbon nanotubes to be obtained by collecting and mutually contacting carbon nanotubes, because an agglomerate of carbon nanotubes scatters unless the structure is sealed with a resin or the like. In addition, in sealing with a resin, carbon nanotubes are fluidized before the patterning owing to the application of the resin, and the resin flows into a contact portion between the carbon nanotubes, thus causing disconnection thereof. As a result, it has been impossible to utilize characteristics of a carbon nanotube.

In the case where a dispersion prepared by dispersing carbon nanotubes into a resin solution in advance is applied, connection through contact between carbon nanotubes cannot be achieved unless the concentration of carbon nanotubes is considerably increased. This is a problem before the patterning.

In the present invention, in the applying step of applying to the surface of a base body a solution containing plural carbon nanotubes having functional groups and a cross-linking agent which prompts a cross-linking reaction with the functional groups (hereinafter, may be simply referred to as "cross-linking application liquid"), an applied film is formed from the cross-linking application liquid on an entire surface of the base body or part of the surface thereof. Then, in the subsequent cross-linking step, the applied film after the application is cured to form a carbon nanotube structure layer having a network structure in which the plural carbon nanotubes mutually cross-link. Through those two steps, the structure itself of the carbon nanotube structure layer can be stabilized on the surface of the base body.

After that, in the patterning step, the carbon nanotube structure layer is patterned into a pattern corresponding to a desired device. At this stage, the structure itself of the carbon nanotube structure layer has been already stabilized in the cross-linking step. Since the patterning is performed for the layer in this state, there is no possibility that a problem in that a carbon nanotube scatters in the patterning step occurs. Therefore, the layer can be patterned into a pattern corresponding to a desired device. In addition, the film itself of the carbon nanotube structure layer is stabilized. Thus, connection between carbon nanotubes is surely secured, with the result that a carbon nanotube device utilizing characteristics of carbon nanotubes can be formed.

In the method of manufacturing a carbon nanotube device according to the present invention, a not-self-polymerizable cross-linking agent is preferably used as the cross-linking agent. When a self-polymerizable cross-linking agent is used as the cross-linking agent and cross-linking agents mutually cause a polymerization reaction during or before the cross-linking reaction in the cross-linking step, the bond between cross-linking agents is enlarged and elongated, and thereby, a gap itself between carbon nanotubes bonded to them inevitably extremely increases. At this time, it is in fact difficult to control the degree of reaction due to the self-polymerizability of cross-linking agents, so that the cross-linking structure between carbon nanotubes varies depending on variations in the polymerization state of cross-linking agents.

However, when a not-self-polymerizable cross-linking agent is used, cross-linking agents do not mutually polymerize at least during or before the cross-linking step. In addition, in the cross-linked site between carbon nanotubes, only a residue of the cross-linking agent by one cross-linking reaction is present as a connecting group between the residues of the functional group remaining after a cross-linking reaction. As a result, the carbon nanotube structure layer to be obtained has entirely uniformized characteristics. Even when the layer is patterned in the patterning step, variations in characteristics of the carbon nanotube structure layer after the patterning can be significantly reduced.

In addition, as long as the cross-linking agents do not cross-link, even when multiple kinds of not-self-polymerizable cross-linking agents are mixed to cross-link carbon nanotubes, a gap between carbon nanotubes can be controlled. Therefore, a similar reducing effect on the variations can be obtained. On the other hand, in the case where carbon nanotubes are cross-linked by using different cross-linking agents in a stepwise manner, when carbon nanotubes are cross-linked by using a not-self-polymerizable cross-linking agent at the initial cross-linking stage, the skeleton of the network structure of carbon nanotubes is completed in a state where a distance between carbon nanotubes is controlled. Therefore, a self-polymerizable cross-linking agent or a cross-linking agent that cross-links the initial cross-linking agent (or a residue thereof) may be used in the subsequent cross-linking step.

The patterning step includes the following two modes A and B.

A: A mode in which the patterning step is a step in which the carbon nanotube structure layer in a region on the surface of the base body other than a region having the pattern corresponding to a desired device is subjected to dry etching to remove the carbon nanotube structure layer in the region, whereby the carbon nanotube structure layer is patterned into a pattern corresponding to the desired device.

Examples of the operation of patterning the carbon nanotube structure layer into a pattern corresponding to the desired device include a mode in which the patterning step further includes: a resist layer forming step of forming a resist layer (preferably, a resin layer) above the carbon nanotube structure layer in a region on the surface of the base body having the pattern corresponding to the desired device; and a removing step of removing the carbon nanotube structure layer exposed in a region other than the above-described region by subjecting a surface of the base body on which the carbon nanotube structure layer and the resist layer are laminated to dry etching (Preferably, the surface is irradiated with an oxygen molecule radical. The oxygen molecule radical can be generated by irradiating oxygen molecules with ultraviolet rays and the resultant oxygen radical is used). In this case, a resist layer peeling-off step of peeling off the resist layer formed in the resist layer forming step is provided subsequent to the removing step, whereby the patterned carbon nanotube structure layer can be exposed.

In addition, in this mode, examples of the operation of patterning the carbon nanotube structure layer into the pattern corresponding to the desired device include a mode of patterning the carbon nanotube structure layer into the pattern corresponding to the desired device by selectively irradiating the carbon nanotube structure layer in a region of the surface of the base body other than the region having the pattern corresponding to the desired device with an ion beam of a gas molecule to remove the carbon nanotube structure layer in the region.

B: A mode in which the patterning step includes:

a resist layer forming step of forming a resist layer above the carbon nanotube structure layer in a region on the surface of the base body having the pattern corresponding to the desired device; and a removing step of removing the carbon nanotube structure layer exposed in a region other than the above-described region by bringing a surface of the base body on which the carbon nanotube structure layer and the resist layer are laminated into contact with an etchant.

In the method of manufacturing a carbon nanotube device of the present invention, examples of the functional group include —OH, —COOH, —COOR (where R represents a substituted or unsubstituted hydrocarbon group), —COX (where X represents a halogen atom), —NH$_2$, and —NCO. A selection of at least one functional group from the group consisting of the above functional groups is preferable, and in such a case, across-linking agent, which may prompt across-linking reaction with the selected functional group, is selected as the cross-linking agent.

Further, examples of the preferable cross-linking agent include a polyol, a polyamine, a polycarboxylic acid, a polycarboxylate, a polycarboxylic acid halide, a polycarbodiimide, and a polyisocyanate. A selection of at least one cross-linking agent from the group consisting of the above cross-linking agents is preferable, and in such a case, a functional group, which may prompt a cross-linking reaction with the selected cross-linking agent, is selected as the functional group.

At least one functional group and one cross-linking agent are preferably selected respectively from the group exemplified as the preferable functional group and the group exemplified as the preferable cross-linking agent, so that a combination of the functional group and the cross-linking agent may prompt a cross-linking reaction with each other.

Particularly preferable examples of the functional group include —COOR (where R represents a substituted or unsubstituted hydrocarbon group). A carboxyl group can be relatively easily introduced into a carbon nanotube, and the resultant substance (a carbon nanotube carboxylic acid) is highly reactive. Therefore, after the formation of the substance, it is relatively easy to esterify the substance to convert its functional group into —COOR (where R represents a substituted or unsubstituted hydrocarbon group). The functional group easily causes a cross-linking reaction, and is suitable for the formation of the applied film.

In addition, a polyol may be the cross-linking agent corresponding to the functional group. A polyol is cured by a reaction with —COOR (where R represents a substituted or unsubstituted hydrocarbon group), and forms a robust cross-linked substance with ease. Among polyols, each of glycerin and ethylene glycol reacts with the above functional groups well. Moreover, each of glycerin and ethylene glycol itself has high biodegradability, and applies a light load to an environment.

In the method of manufacturing a carbon nanotube device of the present invention, the solution to be used in the applying step can further contain a solvent. In addition, depending on the kind of the cross-linking agent, the cross-linking agent can also serve as the solvent.

In the method of manufacturing a carbon nanotube device of the present invention, as described in the section of the carbon nanotube device of the present invention, the base body may have plasticity or flexibility. When the base body has plasticity or flexibility, the base body can be deformed before use according to how the carbon nanotube device to be obtained is used.

Useful applied examples of the method of manufacturing a carbon nanotube device of the present invention include a method of manufacturing a carbon nanotube device, characterized by including:

an applying step of applying to the surface of a temporary substrate a solution containing plural carbon nanotubes having functional groups and a cross-linking agent which prompts a cross-linking reaction with the functional groups;

a cross-linking step of mutually cross-linking the plural carbon nanotubes to construct a network structure through curing of the solution after the application to thereby form a carbon nanotube structure layer having the network structure;

a patterning step of patterning the carbon nanotube structure layer into a pattern corresponding to a desired device; and a transferring step of transferring the patterned carbon nanotube structure layer onto a base body.

In this applied example, in the method of manufacturing a carbon nanotube device described above, a base body is replaced with a temporary substrate, a carbon nanotube structure layer is patterned once on the surface of the temporary substrate, and then the carbon nanotube structure layer is finally transferred onto a desired base body.

In the present invention, a target on which a patterned carbon nanotube structure layer is formed is represented by using the term "base body". Therefore, as in the above applied example, a target on which a patterned carbon nanotube structure layer is temporarily formed is represented by using the term "temporary substrate".

Furthermore, the present invention is not limited to a mode in which the patterned carbon nanotube structure layer is not necessarily directly transferred from the temporary substrate onto the base body as a target onto which the carbon nanotube structure layer is transferred in the transferring step. The present invention also includes a mode in which the patterned carbon nanotube structure layer is once transferred from the temporary substrate onto the surface of an intermediate transfer body, and is then re-transferred onto the base body.

In the case where a rigid base body is used as the temporary substrate and a base body having plasticity or flexibility is used as the base body, the applied example of the method of manufacturing a carbon nanotube device is particularly effective. Alternatively, in the transferring step, the patterned carbon nanotube structure layer may be transferred onto a transfer body having plasticity or flexibility as the intermediate transfer body and then onto a base body which has a desired surface shape or which can be deformed (owing to its plasticity or elasticity, through bending, or the like).

The applied example of the present invention is effective in the case where the cross-linking step includes a step of heating the carbon nanotube structure layer formed on the surface of the temporary substrate at a temperature which is lower than a melting point of the temporary substrate and is equal to or higher than a melting point or a glass transition point of the base body (or the intermediate transfer body when it is used) to cure the solution after the application. That is, even in the case where a base body on which one wishes to form a carbon nanotube structure layer is composed of a material having a low melting point or a low glass transition point, by applying the applied example of the present invention and using a base body having a high melting point for the temporary substrate, heating in the cross-linking step can be performed at a temperature which is lower than the melting point of the temporary substrate and is equal to or higher than the melting point or glass transition point of the base body. As a result, the carbon nanotube device of the present invention can be appropriately manufactured.

In the applied example of the present invention, the patterning step may adopt a step in which the carbon nanotube structure layer in a region on the surface of the temporary substrate other than a region having the pattern corresponding to the desired device is subjected to dry etching to remove the carbon nanotube structure layer in the region, whereby the carbon nanotube structure layer is patterned into a pattern corresponding to the desired device.

At this time, in particular, the applied example of the present invention is effective in the case where the base body (the intermediate transfer body when it is used) has no resistance to the radical or the ion of the gas molecule used for irradiation in the patterning step, but the temporary substrate has resistance to the radical or the ion. That is, even if the base body on which one wishes to form a carbon nanotube structure layer is composed of a material having no resistance to the dry etching performed in the patterning step, by applying the applied example of the present invention and using a base body composed of a material having resistance to the dry etching as the temporary substrate, the operation of dry etching can be performed without any problem, and the carbon nanotube device of the present invention can be appropriately manufactured.

Furthermore, in the applied example of the present invention, the patterning step may include: a resist layer forming step of forming a resist layer above the carbon nanotube structure layer in a region on the surface of the temporary substrate having the pattern corresponding to the desired device; and a removing step of removing the carbon nanotube structure layer exposed in a region other than the region by bringing a surface of the temporary substrate on which the carbon nanotube structure layer and the resist layer are laminated into contact with an etchant.

At this time, in particular, the applied example of the present invention is effective in the case where the base body (the intermediate transfer body when it is used) has no resistance to the etchant used in the patterning step, but the temporary substrate has resistance to the etchant. That is, even if the base body on which one wishes to form a carbon nanotube structure layer is composed of a material having no resistance to the etchant used in the patterning step, by applying the applied example of the present invention and using a base body composed of a material having resistance to the etchant as the temporary substrate, the etchant can be used without any problem, and the carbon nanotube device of the present invention can be appropriately manufactured.

Furthermore, a carbon nanotube transfer body of the present invention to be used in the applied example of the present invention is a carbon nanotube transfer body, characterized in that: a carbon nanotube structure layer having a network structure in which plural carbon nanotubes mutually cross-link, is carried on the surface of a temporary substrate; the carbon nanotube transfer body is used for transferring the carbon nanotube structure layer having a pattern corresponding to a desired device onto a base body; and the temporary substrate is removed from the base body when the carbon nanotube structure layer is transferred onto the base body.

In manufacturing a carbon nanotube device, a carbon nanotube structure layer having a network structure is formed on the surface of a temporary substrate, and is transferred onto a base body serving as part of the device in a state where the layer is patterned according to a desired device. Then, the temporary substrate is removed, whereby the carbon nanotube transfer body of the present invention can be utilized. The utilization of the carbon nanotube transfer body makes it possible to easily manufacture a carbon nanotube device without performing a cross-linking reaction step on the surface of the base body. Carbon nanotubes are carried on the temporary substrate in a cross-linked state, so that the device can be handled with extreme ease.

Examples of a method of removing the temporary substrate include physical peeling, chemical decomposition, burnout, melting, sublimation, and dissolution.

In addition, in the applied example of the present invention, the step of patterning the carbon nanotube structure layer into a pattern corresponding to a desired device is preferably performed in advance on the temporary substrate through a method such as etching described above in the case where fine patterning is required. However, the present invention can also adopt another method involving: cutting the carbon nanotube structure layer together with the temporary substrate into a pattern corresponding to a desired device; attaching the cut pattern to the base body; and removing the temporary substrate. In each of the carbon nanotube devices obtained through the above methods, carbon nanotubes mutually cross-link to construct a network structure, so that connection between carbon nanotubes is certainly formed. At the same time, even in the case where the carbon nanotube structure layer is transferred onto any one of base bodies of various shapes, carbon nanotubes hardly rupture owing to the toughness and flexibility of a carbon nanotube. Thus, interconnection between carbon nanotubes can be maintained at a favorable level even after the transfer.

In preparing a carbon nanotube transfer body, a carbon nanotube structure layer may be formed by subjecting carbon nanotubes to a cross-linking reaction on a temporary substrate. Alternatively, the following procedure may be employed: carbon nanotubes are subjected to a cross-linking reaction on another substrate and the resultant is transferred onto an intermediate transfer body, and the whole is provided as a carbon nanotube transfer body while the intermediate transfer body is regarded as a temporary substrate.

As described above, in the carbon nanotube device and the method of manufacturing the same in the present invention, a cross-linking agent to be used is preferably a not-self-polymerizable cross-linking agent to stably obtain desired characteristics. The same holds true for the carbon nanotube transfer body of the present invention. Furthermore, in the case where the temporary substrate is a substrate having plasticity or flexibility, a pattern of carbon nanotubes can be transferred even if the base body has a complicated surface shape.

BEST MODE FOR CARRYING OUT THE INVENTION

Figure 1:
FIG. 1(a) is a schematic sectional diagram of the surface of a base body showing a state during a manufacturing process for explaining an example of a method of manufacturing a carbon nanotube device of the present invention, showing a state after a cross-linking step.
FIG. 1(b) is a schematic sectional diagram of the surface of the base body showing a state during the manufacturing process for explaining the example of the method of manufacturing a carbon nanotube device of the present invention, showing a state before light exposure and after a resist layer has been formed on the entire surface in a resist layer forming step.
FIG. 1(c) is a schematic sectional diagram of the surface of the base body showing a state during the manufacturing process for explaining the example of the method of manufacturing a carbon nanotube device of the present invention, showing a state after the resist layer forming step.
FIG. 1(d) is a schematic sectional diagram of the surface of the base body showing a state during the manufacturing process for explaining the example of the method of manufacturing a carbon nanotube device of the present invention, showing a state after a removing step.
FIG. 1(e) is a schematic sectional diagram of the surface of the base body showing a state during the manufacturing process for explaining the example of the method of manufacturing a carbon nanotube device of the present invention, showing a state after a resist layer peeling-off step.
Figure 1:
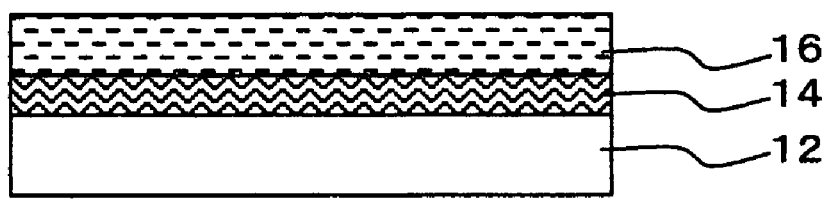
Figure 1:
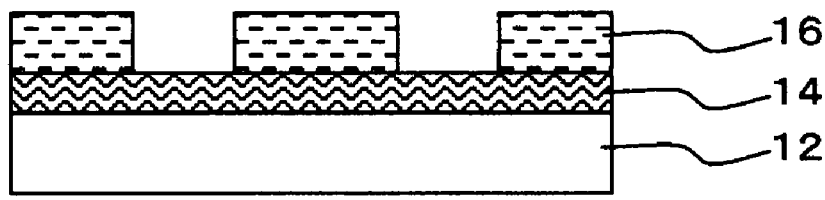
Figure 1:
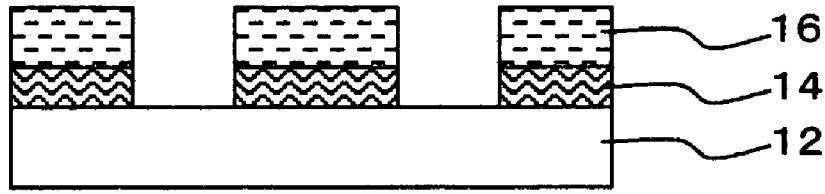
Figure 1:
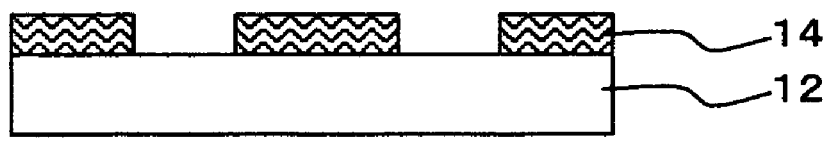
Figure 2A:
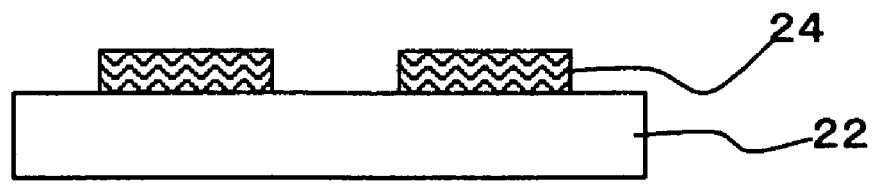
FIG. 2(a) is a schematic sectional diagram of the surface of a base body showing a state during the manufacturing process for explaining an applied example of the method of manufacturing a carbon nanotube device of the present invention, showing a state after a cross-linking step and a patterning step.
Figure 2B:
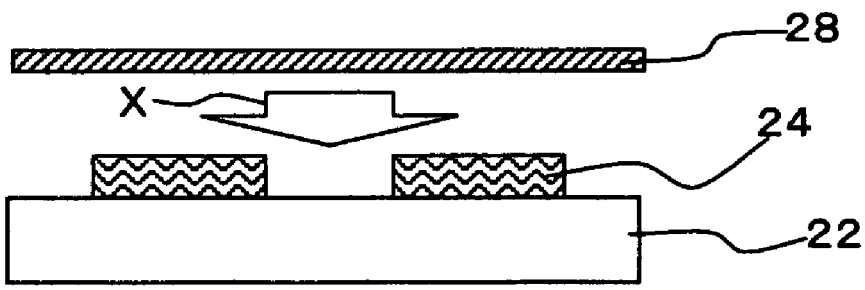
FIG. 2(b) is a schematic sectional diagram of the surface of the base body showing a state during the manufacturing process for explaining the applied example of the method of manufacturing a carbon nanotube device of the present invention, showing a state before moving a base body such as an adhesive tape with an adhesive face of the base body facing toward a temporary substrate on which a carbon nanotube structure layer is formed.
Figure 2C:
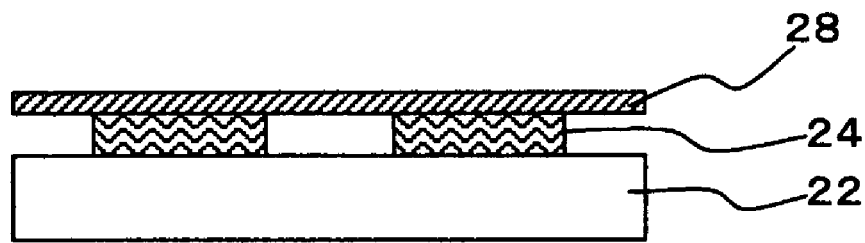
FIG. 2(c) is a schematic sectional diagram of the surface of the base body showing a state during the manufacturing process for explaining the applied example of the method of manufacturing a carbon nanotube device of the present invention, showing a state after the base body has been moved from the state shown in FIG. 2(b).
Figure 2D:
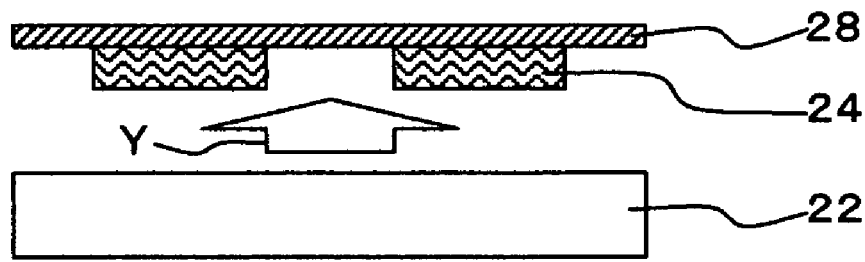
FIG. 2(d) is a schematic sectional diagram of the surface of the base body showing a state during the manufacturing process for explaining the applied example of the method of manufacturing a carbon nanotube device of the present invention, showing a state where the base body is moved and peeled off from the temporary substrate and the carbon nanotube structure layer is transferred onto the adhesive face of the base body.

Hereinafter, the present invention will be described in detail with respect to a carbon nanotube device and a method of manufacturing the same.

Carbon Nanotube Device

The carbon nanotube device of the present invention is characterized by including: a base body; and a carbon nanotube structure layer at least having a network structure in which plural carbon nanotubes mutually cross-link, the carbon nanotube structure layer being formed in an arbitrary pattern on the surface of the base body. A layer other than the carbon nanotube structure layer may be formed on the surface of the base body. In addition, other electrical wirings, electronic components, and the like maybe added. Those arbitrary layers and additional constitutions will be described later as <Constitution of Specific Device>.

Base Body

The term "base body" as used herein refers to a target on which a patterned carbon nanotube structure layer is formed as described above. Here, the "base body" is a member which holds a carbon nanotube structure layer formed in a pattern and constitutes part of the device. In the present invention, the base body is not limited to a flat shape. The base body may have any one of a variety of surface shapes including a spherical shape, a curved shape, a shape having irregularities, and an amorphous shape.

Depending on the shape of the base body, there are a case where a carbon nanotube structure layer can be patterned directly on the surface of the base body, a case where a base body carrying a patterned carbon nanotube structure layer is attached to a second base body, a case where only a patterned carbon nanotube structure layer is transferred, and other cases.

A material for the base body is not particularly limited. In addition to various materials (such as a silicon wafer and a zinc oxide substrate) that have been conventionally used as substrates for electronic devices, various resin materials and inorganic materials can be used without any problem. Although a substrate having an insulating characteristic on its surface is generally used, a substrate having no insulating characteristic (a conductor or a semiconductor) may be used depending on a function of a carbon nanotube structure layer to be formed.

In particular, the carbon nanotube device of the present invention can be easily manufactured as described below even when a substrate having plasticity or flexibility is used as a base body. In addition, the carbon nanotube structure layer formed on the surface of the base body has a cross-linking structure. Therefore, even if the substrate is bent for deformation, the carbon nanotube structure layer on the surface hardly ruptures, with the result that the deterioration of the performance of the device due to deformation is reduced. In particular, in the case where the carbon nanotube device is used as an electrical device, the occurrence of disconnection due to bending is reduced.

Examples of the substrate having plasticity or flexibility include various resins such as polyethylene, polypropylene, polyvinyl chloride, polyamide, and polyimide.

Carbon Nanotube Structure Layer

In the present invention, the "carbon nanotube structure layer" is a layer having a network structure in which plural carbon nanotubes mutually cross-link. The carbon nanotube structure layer may be formed according to any method as long as a layer of carbon nanotubes in which carbon nanotubes mutually cross-link to construct a network structure can be formed. However, the carbon nanotube structure layer is preferably formed according to the method of manufacturing a carbon nanotube device of the present invention to be described later because the layer can be easily manufactured, a low-cost and high-performance device can be obtained, and the uniformization and control of characteristics can be easily performed.

The carbon nanotube structure layer in the carbon nanotube device of the present invention manufactured according to the method of manufacturing a carbon nanotube device of the present invention is obtained by: curing a solution (cross-linking application liquid) containing carbon nanotubes having functional groups and a cross-linking agent which prompts a cross-linking reaction with the functional groups; and subjecting the functional groups of the carbon nanotubes and the cross-linking agent to a cross-linking reaction to form a cross-linked site.

Hereinafter, the carbon nanotube structure layer in the carbon nanotube device of the present invention will be described by taking the manufacturing method as an example.

Carbon Nanotube

Carbon nanotubes, which are the main component in the present invention, may be single-wall carbon nanotubes or multi-wall carbon nanotubes each having two or more layers. Whether one or both types of carbon nanotubes are used (and, if only one type is to be used, which type is selected) may be decided appropriately taking into consideration the use of the carbon tube device, the function of the carbon nanotube structure layer, or the cost.

For example, in the case where the carbon nanotube structure layer is caused to function as an electrical wiring, the plural carbon nanotubes in the layer are preferably multi-wall carbon nanotubes (MWNTs) in order to suppress a resistance loss due to wiring. Although conductive single-wall carbon nanotubes (SWNTs) can be also used, SWNTs are manufactured in a state where semiconductor type SWNTs and conductor type SWNTs are mixed, and it is difficult to extract the conductor type SWNTs. Therefore, MWNTs mainly produced as conductor type ones are preferably used in the case where the carbon nanotube structure layer is caused to function as an electrical wiring.

Carbon nanotubes in the present invention include ones that are not exactly shaped like a tube, such as: a carbon nanohorn (a horn-shaped carbon nanotube whose diameter continuously increases from one end toward the other end) which is a variant of a single-wall carbon nanotube; a carbon nanocoil (a coil-shaped carbon nanotube forming a spiral when viewed in entirety); a carbon nanobead (a spherical bead made of amorphous carbon or the like with its center pierced by a tube); a cup-stacked nanotube; and a carbon nanotube with its circumference covered with a carbon nanohorn or amorphous carbon.

Furthermore, carbon nanotubes in the present invention may be ones that contain some substances inside, such as: a metal-containing nanotube which is a carbon nanotube containing metal or the like; and a peapod nanotube which is a carbon nanotube containing a fullerene or a metal-containing fullerene.

As described above, in the present invention, it is possible to employ carbon nanotubes of any mode, including common carbon nanotubes, variants of common carbon nanotubes, and carbon nanotubes with various modifications, without a problem in terms of reactivity. Therefore, the concept of "carbon nanotube" in the present invention encompasses all of the above.

Those carbon nanotubes are conventionally synthesized by a known method, such as arc discharge, laser ablation, and CVD, and the present invention can employ any of the methods. However, arc discharge in a magnetic field is preferable from the viewpoint of synthesizing a highly pure carbon nanotube.

Carbon nanotubes used in the present invention are preferably equal to and more than 0.3 nm and equal to or less than 100 nm in diameter. If the diameter of the carbon nanotubes exceeds this upper limit, the synthesis becomes difficult and costly. A more desirable upper limit of the diameter of the carbon nanotubes is 30 nm or less.

In general, the lower limit of the carbon nanotube diameter is about 0.3 nm from a structural standpoint. However, too thin a diameter could lower the synthesis yield. It is therefore preferable to set the lower limit of the carbon nanotube diameter to 1 nm or more, more preferably 10 nm or more.

The length of carbon nanotubes used in the present invention is preferably equal to or more than 0.1 µm and equal to or less than 100 µm. If the length of the carbon nanotubes exceeds this upper limit, the synthesis becomes difficult or requires a special method raising cost, which is not preferable. On the other hand, if the length of the carbon nanotubes falls short of this lower limit, the number of cross-link bonding points per carbon nanotube is reduced, which is not preferable. A more preferable upper limit of the carbon nanotube length is 10 µm or less and a more preferable lower limit of the carbon nanotube length is 1 µm or more.

The appropriate carbon nanotube content in the cross-linking application liquid varies depending on the length and thickness of carbon nanotubes, whether single-wall carbon nanotubes or multi-wall carbon nanotubes are used, the type and amount of functional groups in the carbon nanotubes, the type and amount of cross-linking agents, the presence or absence of a solvent or other additive used and, if one is used, the type and amount of the solvent or additive, etc. The carbon nanotube content in the solution should be high enough to form an excellent applied film after curing but not be excessively high because the application suitability lowers.

Specifically, the ratio of carbon nanotubes to the entire application liquid excluding the mass of the functional groups is about 0.01 to 10 g/l, preferably about 0.1 to 5 g/l, and more preferably about 0.5 to 1.5 g/l, although, as mentioned above, the ranges could be different if the parameters are different.

If the purity of carbon nanotubes to be used is not high enough, it is desirable to raise the purity by refining the carbon nanotubes prior to preparation of the cross-linking application liquid. In the present invention, the higher the carbon nanotube purity, the better the result can be. Specifically, the purity is preferably 90% or higher, more desirably, 95% or higher. When the purity is low, cross-linking agents are cross-linked to carbon products such as amorphous carbon and tar, which are impurities. This could change the cross-linking distance between carbon nanotubes, leading to a failure in obtaining desired characteristics. No particular limitation is put on how carbon nanotubes are refined, and any known refining method can be employed.

Functional Group

In the present invention, carbon nanotubes can have any functional group to be connected thereto, as long as functional groups selected can be added to the carbon nanotubes chemically and can prompt a cross-linking reaction with any type of cross-linking agent. Specific examples of such functional groups include —COOR, —COX, —MgX, —X (where X represents halogen), —OR, —NR$^1$R$^2$, —NCO, —NCS, —COOH, —OH, —NH$_2$, —SH, —SO$_3$H, —R'CHOH, —CHO, —CN, —COSH, —SR, —SiR'$_3$ (where R, R$^1$, R$^2$, and R' each independently represent a substituted or unsubstituted hydrocarbon group). Note that employable functional groups are not limited to those examples.

Of those, it is preferable to use at least one functional group selected from the group consisting of —OH, —COOH, —COOR (where R represents a substituted or unsubstituted hydrocarbon group), —COX (where X represents a halogen atom), —NH$_2$, and —NCO. In that case, a cross-linking agent, which can prompt a cross-linking reaction with the selected functional group, is selected as the cross-linking agent.

In particular, —COOR (where R represents a substituted or unsubstituted hydrocarbon group) is particularly preferable. This is because a carboxyl group can be relatively easily introduced into a carbon nanotube, because the resultant substance (a carbon nanotube carboxylic acid) can be easily introduced as a functional group by esterifying the substance, and because the substance has good reactivity with a cross-linking agent.

R in the functional group —COOR is a substituted or unsubstituted hydrocarbon group, and is not particularly limited. However, R is preferably an alkyl group having 1 to 10 carbon atoms, more preferably an alkyl group having 1 to 5 carbon atoms, and particularly preferably a methyl group or an ethyl group in terms of reactivity, solubility, viscosity, and ease of use as a solvent of a paint.

The appropriate amount of functional groups introduced varies depending on the length and thickness of carbon nanotubes, whether single-wall carbon nanotubes or multi-wall carbon nanotubes are used, the types of functional groups, the use of the carbon nanotube device, etc. From the viewpoint of the strength of the cross-linked substance obtained, namely, the strength of the applied film, a preferable amount of functional groups introduced is large enough to add two or more functional groups to each carbon nanotube. How functional groups are introduced into carbon nanotubes will be explained in the section below titled [Method of Manufacturing a Carbon Nanotube Device].

Cross-Linking Agent

Any cross-linking agent, which is an essential ingredient of the cross-linking application liquid, can be used as long as the cross-linking agent is capable of prompting a cross-linking reaction with the functional groups of the carbon nanotubes. In other words, the types of cross-linking agents that can be selected are limited to a certain degree by the types of the functional groups. Also, the conditions of curing (heating, UV irradiation, irradiation of visible light, natural curing, etc.) as a result of the cross-linking reaction are naturally determined by the combination of those parameters.

Specific examples of the preferable cross-linking agents include a polyol, a polyamine, a polycarboxylic acid, a polycarboxylate, a polycarboxylic acid halide, a polycarbodiimide, and a polyisocyanate. It is desirable to use at least one cross-lining agent selected from the group consisting of the above. In that case, a functional group which can prompt a reaction with the cross-linking agent is selected as the functional group.

At least one functional group and one cross-linking agent are particularly preferably selected respectively from the group consisting of functional groups exemplified as the preferable functional group and the group consisting of cross-linking agents exemplified as the preferable cross-linking agent, so that a combination of the functional group and the cross-linking agent may prompt a cross-linking reaction with each other. Table 1 below lists the combinations of the functional group of the carbon nanotubes and the corresponding cross-linking agent, which can prompt a cross-linking reaction, along with curing conditions of the combinations.

TABLE 1

| Functional group of carbon nanotube | Cross-linking agent | Curing condition |
|---|---|---|
| —COOR | Polyol | heat curing |
| —COX | Polyol | heat curing |
| —COOH | Polyamine | heat curing |
| —COX | Polyamine | heat curing |
| —OH | Polycarboxylate | heat curing |
| —OH | Polycarboxylic acid halide | heat curing |
| —NH$_2$ | Polycarboxylic acid | heat curing |
| —NH$_2$ | Polycarboxylic acid halide | heat curing |
| —COOH | Polycarbodiimide | heat curing |
| —OH | Polycarbodiimide | heat curing |
| —NH$_2$ | Polycarbodiimide | heat curing |
| —NCO | Polyol | heat curing |
| —OH | Polyisocyanate | heat curing |

*where R represents a substituted or unsubstituted hydrocarbon group
*where X represents a halogen Of those combinations, preferable is the combination of —COOR (where R represents a substituted or unsubstituted hydrocarbon group) with good reactivity on a functional group side and a polyol which forms a robust cross-linked substance with ease. The terms "polyol" in the present invention is a generic name for organic compounds each having two or more OH groups. Of those, one having 2 to 10 (more preferably 2 to 5) carbon atoms and 2 to 22 (more preferably 2 to 5) OH groups is preferable in terms of cross-linkability, solvent compatibility when an excessive amount thereof is charged, proccessability of waste liquid after a reaction by virtue of biodegradability (environment aptitude), yield of polyol synthesis, and so on. In particular, the number of carbon atoms is preferably lower within the above range because a gap between carbon nanotubes in the resultant applied film can be narrowed to bring the carbon nanotubes into substantial contact with each other (to bring the carbon nanotubes close to each other). Specifically, glycerin and ethylene glycol are particularly preferable, and it is preferable to use one or both of glycerin and ethylene glycol as a cross-linking agent.

From another perspective, the cross-linking agent is preferably a not-self-polymerizable cross-linking agent. Glycerin and ethylene glycol as examples of the polyols are obviously not-self-polymerizable cross-linking agents. More generally, a prerequisite of the not-self-polymerizable cross-linking agent is to be without a pair of functional groups, which can prompt a polymerization reaction with each other, in itself. On the other hand, examples of a self-polymerizable cross-linking agent include one that has a pair of functional groups, which can prompt a polymerization reaction with each other (alkoxide, for example).

The content of a cross-linking agent in the cross-linking application liquid varies depending on the type of the cross-linking agent (including whether the cross-linking agent is self-polymerizable or not self-polymerizable). The content also varies depending on the length and thickness of a carbon nanotube, whether the carbon nanotube is of a single-wall type or a multi-wall type, the type and amount of a functional group of the carbon nanotube, the presence or absence of a solvent or other additives, and, if one is used, the type and amount thereof, and the like. Therefore, the content can not be determined uniquely. In particular, for example, glycerin or ethylene glycol can also provide characteristics of a solvent because a viscosity of glycerin or ethylene glycol is not so high, and thus an excessive amount of glycerin or ethylene glycol can be added.

Other Additive

The cross-linking application liquid may contain various additives including a solvent, a viscosity adjuster, a dispersant, and a cross-linking accelerator.

A solvent is added when satisfactory application suitability of the cross-linking application liquid is not achieved with solely the cross-linking agents. A solvent that can be employed is not particularly limited, and may be appropriately selected according to the types of the cross-linking agents. Specific examples of employable solvents include: organic solvents such as methanol, ethanol, isopropanol, n-propanol, butanol, methyl ethyl ketone, toluene, benzene, acetone, chloroform, methylene chloride, acetonitrile, diethyl ether, and tetrahydrofuran (THF); water; aqueous solutions of acids; and alkaline aqueous solutions. A solvent as such is added in an amount that is not particularly limited but determined appropriately by taking into consideration the application suitability of the cross-linking application liquid.

A viscosity adjuster is added when satisfactory application suitability of the cross-linking application liquid is not achieved with solely the cross-linking agents. A viscosity adjuster that can be employed is not particularly limited, and maybe appropriately selected according to the cross-linking agents used. Specific examples of employable viscosity adjusters include methanol, ethanol, isopropanol, n-propanol, butanol, methyl ethyl ketone, toluene, benzene, acetone, chloroform, methylene chloride, acetonitrile, diethyl ether, and THF.

Some of those viscosity adjusters have the function of a solvent when added in a certain amount, and it is meaningless to apparently discriminate viscosity adjusters from solvents. A viscosity adjuster as such is added in an amount that is not particularly limited but determined by taking into consideration the application suitability of the cross-linking application liquid.

A dispersant is added to the cross-linking application liquid in order to maintain the dispersion stability of the carbon nanotubes or the cross-linking agents in the application liquid. Various known surface-active agents, water-soluble organic solvents, water, aqueous solutions of acids, alkaline aqueous solutions, etc. can be employed as a dispersant. However, a dispersant is not always necessary since components of the coating material of the present invention have high dispersion stability by themselves. In addition, depending on the use of the applied film after the formation, the presence of a dispersant and like other impurities in the applied film may not be desirable. In such case, a dispersant is not added at all, or is added in a very small amount.

Method of Preparing the Cross-Linking Application Liquid

A method of preparing a cross-linking application liquid is described next.

The cross-linking application liquid is prepared by mixing carbon nanotubes that have functional groups with a cross-linking agent that prompts a cross-linking reaction with the functional groups (mixing step). The mixing step may be preceded by an addition step in which the functional groups are introduced into the carbon nanotubes.

If carbon nanotubes having functional groups are starting materials, the preparation starts with the mixing step. If normal carbon nanotubes themselves are starting materials, the preparation starts with the addition step.

The addition step is a step of introducing desired functional groups into carbon nanotubes. How functional groups are introduced varies depending on the type of functional group. One method is to add a desired functional group directly, and another method is to introduce a functional group that is easy to attach and then substitute the whole functional group or a part thereof or attach a different functional group to the former functional group in order to obtain the objective functional group.

Still another method is to apply a mechanochemical force to a carbon nanotube to break or modify only a small portion of a graphene sheet on the surface of the carbon nanotube and introduce various functional groups from the broken or modified portion.

Cup-stacked carbon nanotubes, which have many defects on the surface upon manufacture, and carbon nanotubes that are formed by vapor phase growth are relatively easy to introduce functional groups. On the other hand, carbon nanotubes each having a perfect graphene sheet structure exert the carbon nanotube characteristics more effectively and are easier to control the characteristics. Consequently, it is particularly preferable to use a multi-wall carbon nanotube so that defects are formed as many as appropriate as a carbon nanotube device on its outermost layer to bond functional groups for cross-linking while the inner layers having less structural defects exert the carbon nanotube characteristics.

There is no particular limitation put on the addition step and any known method can be employed. Various addition methods disclosed in JP Patent Document 1 may be employed in the present invention depending on the purpose.

A description is given on a method of introducing —COOR (where R represents a substituted or unsubstituted hydrocarbon group), a particularly desirable functional group among the functional groups listed in the above. To introduce —COOR (where R represents a substituted or unsubstituted hydrocarbon group) into carbon nanotubes, carboxyl groups may be (1) added to the carbon nanotubes once, and then (2) esterified.

(1) Addition of Carboxyl Group

To introduce carboxyl groups into carbon nanotubes, carboxyl groups are refluxed together with an acid having an oxidizing effect. This operation is relatively easy and is preferable since carboxyl groups with high reactivity are attached to carbon nanotubes. A brief description of the operation is given below.

An acid having an oxidizing effect is, for example, concentrated nitric acid, hydrogen peroxide water, a mixture of sulfuric acid and nitric acid, or aqua regia. When concentrated nitric acid is used, in particular, the concentration is preferably 5 mass % or higher, more preferably, 60 mass % or higher.

A normal reflux method can be employed. The temperature at which reflux is performed is preferably set to a level near the boiling point of the acid used. When concentrated nitric acid is used, for instance, the temperature is preferably set to 120 to 130° C. The reflux preferably lasts 30 minutes to 20 hours, more preferably, 1 hour to 8 hours.

Carbon nanotubes to which carboxyl groups are attached (a carbon nanotube carboxylic acid) are generated in the reaction liquid after the reflux. The reaction liquid is cooled down to room temperature and then receives a separation operation or washing as necessary, thereby obtaining the objective carbon nanotube carboxylic acid.

(2) Esterification

The target functional group —COOR (where R represents a substituted or unsubstituted hydrocarbon group) can be introduced by adding an alcohol to the obtained carbon nanotube carboxylic acid and dehydrating the mixture for esterification.

The alcohol used for the esterification is determined according to R in the formula of the functional group. That is, if R is $CH_3$, the alcohol is methanol, and if R is $C_2H_5$, the alcohol is ethanol.

A catalyst is generally used in the esterification, and a conventionally known catalyst such as sulfuric acid, hydrochloric acid, or toluene sulfonic acid can also be used in the present invention. The use of sulfuric acid as a catalyst is preferable from a view of not prompting a side reaction in the present invention.

The esterification may be conducted by adding an alcohol and a catalyst to a carbon nanotube carboxylic acid and refluxing the mixture at an appropriate temperature for an appropriate time period. A temperature condition and a time period condition in this case depend on type of a catalyst, type of alcohol, or the like and cannot be simply determined, but a reflux temperature close to the boiling point of the alcohol used is preferable. The reflux temperature is preferably in the range of 60 to 70° C. for methanol, for example. Further, a reflux time period is preferably in the range of 1 to 20 hours, more preferably in the range of 4 to 6 hours.

A carbon nanotube with the functional group —COOR (where R represents a substituted or unsubstituted hydrocarbon group) added can be obtained by separating a reaction product from a reaction solution after esterification and washing the reaction product as required.

The mixing step is a step of mixing carbon nanotubes having functional groups with a cross-linking agent prompting a cross-linking reaction with the functional groups to prepare the cross-linking application liquid. In the mixing step, other components described in the aforementioned section titled [Carbon Nanotube Device] are mixed, in addition to the carbon nanotubes having functional groups and the cross-linking agents. Then, preferably, an addition amount of a solvent or a viscosity adjuster is adjusted considering application suitability to prepare the cross-linking application liquid just before application to the substrate.

Simple stirring with a spatula and stirring with a stirrer of a stirring blade type, a magnetic stirrer, and a stirring pump may be used for the mixing. However, to achieve higher degree of uniformity in dispersion of the carbon nanotubes to enhance storage stability while fully extending a network structure by cross-linking of the carbon nanotubes, an ultrasonic disperser or a homogenizer may be used for powerful dispersion. However, when using a stirring device with a strong shear force of stirring such as a homogenizer, there arises a risk of cutting and damaging the carbon nanotubes in the solution, thus the device may be used for a very short time period.

A carbon nanotube structure layer is formed by applying a substrate surface with the cross-linking application liquid described above and curing the substrate. An applying method and a curing method are described in detail in the section below titled [Method of Manufacturing a Carbon Nanotube Device].

The carbon nanotube structure layer in the present invention is in a state where carbon nanotubes are networked. In detail, the carbon nanotube structure layer is cured into a matrix shape, carbon nanotubes are connected to each other via cross-linked sites, and characteristics of a carbon nanotube itself such as high electron- and hole-transmission characteristics can be exerted sufficiently. In other words, the carbon nanotube structure layer has carbon nanotubes that are tightly connected to each other, contains no other binders and the like, and is thus composed substantially only of carbon nanotubes, so that characteristics that are unique of a carbon nanotube are fully utilized.

A thickness of the carbon nanotube structure layer of the present invention can be widely selected from being very thin to being thick according to an application. Lowering a content of the carbon nanotubes in the cross-linking application liquid used (simply, lowering the viscosity by diluting) and applying the cross-linking application liquid in a thin coat form allows a very thin applied film to be obtained. Similarly, raising a content of the carbon nanotubes allows a thick applied film to be obtained. Further, repeating the application allows an even thicker applied film to be obtained. Formation of a very thin applied film from a thickness of about 10 nm is possible, and formation of a thick applied film without an upper limit is possible through recoating. A possible coat thickness with one coating is about 5 μm.

In the carbon nanotube structure layer, a site where the carbon nanotubes cross-link together, that is, the cross-linked site formed by a cross-linking reaction between the functional groups of the carbon nanotubes and the cross-linking agent has a cross-linking structure. In the cross-linking structure, residues of the functional group remaining after a cross-linking reaction are connected together with a connecting group, which is a residue of the cross-linking agent remaining after a cross-linking reaction.

As described, the cross-linking agent, which is a component of the cross-linking application liquid, is preferably not self-polymerizable. If the cross-linking agent is not self-polymerizable, the connecting group of the carbon nanotube structure layer finally manufactured would be constructed from a residue of only one cross-linking agent. The gap between the carbon nanotubes to be cross-linked can be controlled to a size of a residue of the cross-linking agent used, thereby providing a desired network structure of the carbon nanotubes with high duplicability. Further, reducing a size of a residue of the cross-linking agent can extremely narrow a gap between the carbon nanotubes both electrically and physically (carbon nanotubes are substantially in direct contact with each other).

When forming the carbon nanotube structure layer with a cross-linking application liquid prepared by selecting a single functional group of the carbon nanotubes and a single not-self-polymerizable cross-linking agent, the cross-linked site of the layer will have the same cross-linking structure (Example 1) Further, even when forming the carbon nanotube structure layer with a cross-linking application liquid prepared by selecting plural types of functional groups of the carbon nanotubes and/or plural types of not-self-polymerizable cross-linking agents, the cross-linked site of the layer will mainly have a cross-linking structure based on a combination of the functional group and the not-self-polymerizable cross-linking agent mainly used (Example 2).

In contrast, when forming the carbon nanotube structure layer with a cross-linking application liquid prepared by selecting self-polymerizable cross-linking agents, without regard to whether the functional groups and the cross-linking agents are of single or plural types, the cross-linked site of the layer where carbon nanotubes cross-link together will not mainly have a specific cross-linking structure. This is because the cross-linked site will be in a state where numerous connecting groups with different connecting (polymerization) numbers of the cross-linking agents coexist.

In other words, by selecting not-self-polymerizable cross-linking agents, the cross-linked sites of the carbon nanotube structure layer where the carbon nanotubes cross-link together bond with the functional group through a residue of only one cross-linking agent, thus forming a mainly identical cross-linking structure. "Mainly identical" here is a concept including a case with all of the cross-linked sites having an identical cross-linking structure as described above (Example 1), as well as a case with the cross-linking structure based on a combination of the functional group and the not-self-polymerizable cross-linking agent mainly used becomes a main structure with respect to the whole cross-linked site as described above (Example 2).

When referring as "mainly identical", a "ratio of identical cross-linked sites" with respect to the whole cross-linked sites will not have a uniform lower limit defined. The reason is that a case of imparting a functional group or a cross-linking structure with an aim different from formation of a carbon nanotube network may be assumed, for example. However, in order to actualize high electrical or physical characteristics that are unique of carbon nanotubes with a strong network, a "ratio of identical cross-linked sites" with respect to the total cross-linked sites is preferably 50% or more, more preferably 70% or more, further more preferably 90% or more, and most preferably 100%, based on numbers. Those number ratios can be determined through, for example, a method of measuring an intensity ratio of an absorption spectrum corresponding to the cross-linking structure with an infrared spectrum.

As described, if a carbon nanotube structure layer has the cross-linked site with a mainly identical cross-linking structure where carbon nanotubes cross-link, a uniform network of the carbon nanotubes can be formed in a desired state. In addition, the carbon nanotube network can be constructed with homogeneous, satisfactory, and expected electrical or physical characteristics and high duplicability.

Further, the connecting group preferably employs a hydrocarbon as its skeleton. "Hydrocarbon as its skeleton" here refers to a main chain portion of the connecting group consisting of hydrocarbon, the main portion of the connecting group contributing to connecting residues together of the functional groups of carbon nanotubes to be cross-linked remaining after a cross-linking reaction. A side chain portion, where hydrogen of the main chain portion is substituted by another substituent, is not considered. Obviously, it is more preferable that the whole connecting group consists of hydrocarbon.

The number of carbon atoms in the hydrocarbon is preferably 2 to 10, more preferably 2 to 5, and further more preferably 2 to 3. The connecting group is not particularly limited as long as the connecting group is divalent or more.

In the cross-linking reaction of the functional group —COOR (where R represents a substituted or unsubstituted hydrocarbon) and ethylene glycol, exemplified as a preferable combination of the functional group of carbon nanotubes and the cross-linking agent, the cross-linked site where plural carbon nanotubes mutually cross-link becomes —COO(CH$_2$)$_2$OCO—.

Further, in the cross-linking reaction of the functional group —COOR (where R represents a substituted or unsubstituted hydrocarbon) and glycerin, the cross-linked site where plural carbon nanotubes mutually cross-link becomes —COOCH$_2$CHOHCH$_2$OCO— or —COOCH$_2$CH(OCO—)CH$_2$H if two OH groups contribute in the cross-link, and the cross-linked site becomes —COOCH$_2$CH(OCO—)CH$_2$OCO— if three OH groups contribute in the cross-link.

As has been described, the carbon nanotube device of the present invention is formed in a state where the carbon nanotube structure layer has a network structure that is composed of plural carbon nanotubes connected to each other through plural cross-linked sites. Thus, contact or arrangement of carbon nanotubes is not disturbed, unlike a mere carbon nanotube dispersion film. Therefore, there are stably obtained characteristics that are unique of carbon nanotubes, including: electrical characteristics such as high electron- and hole-transmission characteristics; physical characteristics such as thermal conductivity and toughness; and light absorption characteristics. In addition, devices with a wide variety of constitutions can be obtained because the degree of freedom of the pattern of the carbon nanotube structure layer is also high.

Constitution of Specific Device

The constitution of the carbon nanotube device of the present invention having such prominent characteristics will be described by way of specific examples.

The carbon nanotube device of the present invention is characterized by including: a base body; and the carbon nanotube structure layer formed in an arbitrary pattern on the surface of the base body. The arbitrary pattern is formed according to a purpose, whereby a device can be constituted with such a constitution alone. Alternatively, the device can be entirely constituted by adding another layer or another member.

In the present invention, the "arbitrary pattern" is a surface shape corresponding to an application of the carbon nanotube device, and is mainly a two-dimensional shape (pattern). The pattern can be easily and freely formed according to the method of manufacturing a carbon nanotube device of the present invention.

For example, the "arbitrary pattern" is formed like a so-called wiring of a printed board, whereby the carbon nanotube device of the present invention can be used directly as a printed board for a minute electronic device. At this time, the carbon nanotube structure layer functions as an electrical wiring.

The "arbitrary pattern" is formed like a two-dimensional coil (a so-called eddy shape), whereby the carbon nanotube device of the present invention can be directly used as a minute two-dimensional coil (Example (1) in which at least part of the arbitrary pattern constituted an electrical component).

The "arbitrary pattern" is formed into a simple linear shape or curved shape, whereby the carbon nanotube device of the present invention can be directly used as an electrical wiring for conduction of electricity between both ends of the line or of the curve. At this time, the carbon nanotube device can also be used as a resistor by appropriately selecting the types of carbon nanotubes used and cross-linking structures of plural carbon nanotubes (Example (2) in which at least part of the arbitrary pattern constitutes an electrical component). More specifically, it is desirable, for example, to increase the ratio of SWNTs with respect to the total amount of carbon nanotubes used or to make the cross-linking structure relatively long to extent the gap between plural carbon nanotubes, so that the entire electrical resistance increases. In the method of manufacturing a carbon nanotube device of the present invention to be described below, a resistor having a desired electrical resistance can be easily manufactured (particularly by using a not-self-polymerizable cross-linking agent).

The "arbitrary pattern" is formed into an entire solid pattern or a network shape, whereby the carbon nanotube device of the present invention can be directly used as an electromagnetic wave shield or absorber.

The carbon nanotube device of the present invention may have a layer other than the carbon nanotube structure layer.

For example, it is preferable to place an adhesive layer between the surface of the base body and the carbon nanotube structure layer for increasing the adhesiveness between them because the adhesive strength of the patterned carbon nanotube structure layer can be increased. A method of forming the adhesive layer and other details will be described in the section titled [Method of manufacturing Carbon Nanotube Device].

Furthermore, a protective layer or any one of other various functional layers can be placed as an upper layer on the patterned carbon nanotube structure layer. When the protective layer is placed, the carbon nanotube structure layer as a network of cross-linked carbon nanotubes can be more strongly held on the surface of the base body, and can be protected from an external force. A resist layer to be described in the section [Method of Manufacturing Carbon Nanotube Device] can be used without removal as the protective layer. Of course, a protective layer for covering the entire surface including a region other than a pattern corresponding to the desired device can be newly provided. Any one of conventionally known various resin materials and inorganic materials can be used as a material constituting such a protective layer without any problem depending on purposes. However, in the case where the carbon nanotube device of the present invention is used as an electrical device, an insulating material is selected as a material for the protective layer.

Increasing the thickness of the protective layer for covering the entire surface including the region other than a region having the pattern corresponding to the desired device enables the carbon nanotube device of the present invention to be used as a structural material. The carbon nanotube structure layer has a network where plural carbon nanotubes cross-link. The carbon nanotube device of the present invention in which the network functions as a filler or reinforcer can be a structural material having extremely high mechanical strength as compared to general fiberglass reinforced plastics (FRP) in which fillers are present in a piecemeal fashion. At this time, the "arbitrary pattern" may be of any one of an entire solid pattern, a network shape, a grid shape, a slit shape, or other arbitrary shapes, and has only to be designed on applications of the carbon nanotube device as a structural material, and desired mechanical strength.

As described above, in the case where the carbon nanotube device of the present invention is used as a structural material, the following procedure is desirably adopted: a thick-walled material is used for the base body, a material having a shape depending on an application is used for the base body, or another layer is formed of resin on the opposite surface of the base body, so that a target shape for the structural material is entirely obtained.

Furthermore, the carbon nanotube structure layers can be laminated through some type of functional layer. An insulating layer is formed as the functional layer, an appropriate pattern is employed for each of the carbon nanotube structure layers, and the carbon nanotube structure layers are appropriately connected to each other, whereby a highly integrated device can be fabricated. Connection between layers at this time may be performed by separately providing a carbon nanotube structure layer, by using another carbon nanotube for wiring, or by any one of completely different methods such as the use of a metal film.

In addition, a minute capacitor can be fabricated by providing a dielectric layer as the functional layer and sandwiching the dielectric layer between carbon nanotube structure layers patterned into flat plate shapes (Example (3) in which at least part of the arbitrary pattern constitutes an electrical component) In those cases, a resist layer to be described in the section [Method of Manufacturing Carbon Nanotube Device] can be used without removal as the functional layer.

By appropriately constituting the "arbitrary pattern", an active electric device can be fabricated, in which the carbon nanotube structure layer to be obtained itself (or part thereof) functions as an electrical component serving as a component of the active electric device.

For example, the carbon nanotube structure layer is patterned and constituted so as to function as a semiconductor layer and/or at least one of source, drain, and gate electrodes, whereby a device (active electric device) that functions as a transistor or a field-effect transistor (FET) can be manufactured. At this time, other constitutions (such as a wiring, a terminal, another electrode, and a semiconductor layer) can be constituted by using carbon nanotube structure layers or by using other members separately.

In the present invention, a carbon nanotube device can be obtained, in which another electrical component is connected to the carbon nanotube structure layer formed in a pattern constituting an electrical wiring. Another electrical component such as a transistor, a diode, a light-emitting diode, a resistor, a capacitor, or a coil is connected to part (terminal) of the electrical wiring formed of the carbon nanotube structure layer, whereby the resultant can function as a device having a function of the connected electrical component. In addition, a device that functions as various integrated circuits can be manufactured by incorporating multiple of those electrical components and forming the electrical wiring so as to constitute an appropriate electrical circuit. At this time, part of the carbon nanotube structure layer other than the part to be used for the electrical wiring may be constituted so as to function as an electrical component as described above.

In addition, as described above, the base body maybe a substrate having plasticity or flexibility. When the base body is a substrate having plasticity or flexibility, the flexibility of the entire carbon nanotube device increases, and the degree of freedom in use environments such as an installation location remarkably increases.

In addition, in the case where a carbon nanotube device using such a substrate having plasticity or flexibility is used to constitute a device, high performance unique of a carbon nanotube can be exerted while conforming to various arrangements and shapes in the device.

The specific shape and the like of the carbon nanotube device of the present invention will be revealed in the next section titled [Method of Manufacturing Carbon Nanotube Device] and the section Examples. Of course, specific modes of the carbon nanotube device of the present invention cover an extremely broad spectrum and have unlimited possibilities. Therefore, the constitutions to be described later are merely illustrations, and the present invention is not limited to them.

Method of Manufacturing Carbon Nanotube Device

The method of manufacturing a carbon nanotube device of the present invention is a method suitable for manufacturing the carbon nanotube device of the present invention described above. More specifically, the method is characterized by including:

(A) an applying step of applying to the surface of a base body a solution containing plural carbon nanotubes having functional groups and a cross-linking agent which prompts a cross-linking reaction with the functional groups;

(B) a cross-linking step of mutually cross-linking the plural carbon nanotubes to construct a network structure through curing of the solution after the application to thereby form a carbon nanotube structure layer having the network structure; and (C) a patterning step of patterning the carbon nanotube structure layer into a pattern corresponding to a desired device.

In addition, a step other than those steps ((D) other step) may be added.

Hereinafter, each step of the method of manufacturing a carbon nanotube device of the present invention will be described in detail with reference to FIG. 1. Here, FIG. 1 are schematic views of the surface of the base body during the manufacturing process for explaining an example ((C-A-2) to be described below) of the method of manufacturing a carbon nanotube device of the present invention. In the figures, reference numeral 12 denotes a substrate-like base body; 14, a carbon nanotube structure layer; and 16, a resist layer.

Applied examples of the method of manufacturing a carbon nanotube device of the present invention will be collectively explained finally.

(A) Applying Step

In the present invention, the "applying step" is a step of applying to the surface of the base body a solution (cross-linking application liquid) containing plural carbon nanotubes having functional groups and a cross-linking agent which prompts a cross-linking reaction with the functional groups. A region to which the cross-linking application liquid is to be applied has only to include the desired region, and it is not necessary to apply the liquid to the entire surface of the base body.

The applying method is not particularly limited, and any method can be adopted from a wide range to apply the cross-linking application liquid. For example the liquid may be simply dropped or spread with a squeegee or maybe applied by a common application method. Examples of common application methods include spin coating, wire bar coating, cast coating, roll coating, brush coating, dip coating, spray coating, and curtain coating.

The contents of the base body, the carbon nanotubes having functional groups, the cross-linking agent, and the cross-linking application liquid are as described in the section titled [Carbon Nanotube Device].

(B) Cross-Linking Step

In the present invention, the "cross-linking step" is a step of mutually cross-linking the plural carbon nanotubes to construct a network structure through curing of the cross-linking application solution after the application to thereby form a carbon nanotube structure layer having the network structure. A region where the carbon nanotube structure layer is to be formed by curing the cross-linking application liquid in the cross-linking step has only to include the desired region, and it is not necessary to the entirety of the cross-linking application liquid applied to the surface of the base body. FIG. 1(a) shows a schematic sectional diagram showing a state of the surface of the base body after (B) cross-linking step.

An operation carried out in the cross-linking step is naturally determined according to the combination of the functional groups with the cross-linking agent as shown in, for example, Table 1 above. If a combination of thermally curable functional groups is employed, the applied solution is heated by various heaters or the like. If a combination of functional groups that are cured by ultraviolet rays is employed, the applied solution is irradiated with a UV lamp or left under the sun. If a combination of self-curable functional groups is employed, it is sufficient to let the applied solution standstill. "Leaving the applied solution to stand still" is deemed as one of the operations that may be carried out in the cross-linking step of the present invention.

Heat curing (polyesterification through an ester exchange reaction) is conducted for the case of a combination of a carbon nanotube, to which the functional group —COOR (where R represents a substituted or unsubstituted hydrocarbon group) is added, and a polyol (among them, glycerin and/or ethylene glycol). Heating causes an ester exchange reaction between —COOR of the esterified carbon nanotube carboxylic acid and R'—OH (where R' represents a substituted or unsubstituted hydrocarbon group) of a polyol. As the reaction progresses multilaterally, the carbon nanotubes are cross-linked until a network of carbon nanotubes connected to each other constructs a carbon nanotube structure layer 14.

To give an example of conditions preferable for the above combination, the heating temperature is specifically set to preferably 50 to 500° C., more preferably 150 to 200° C., and the heating period is specifically set to preferably 1 minute to 10 hours, more preferably 1 hour to 2 hours.

(C) Patterning Step

In the present invention, the "patterning step" is a step of patterning the carbon nanotube structure layer into a pattern corresponding to a desired device. FIG. 1(e) is a schematic sectional view showing a state of the surface of the base body after (C) Patterning Step.

Although no particular limitations are put on operations of the patterning step, there are two preferred modes of (C-A) and (C-B) to the patterning step.

(C-A)

A mode in which dry etching is performed on the carbon nanotube structure layer in a region of the surface of the base body other than the region having the pattern corresponding to the desired device, thus removing the carbon nanotube structure layer from those region and patterning the carbon nanotube structure layer into the pattern corresponding to the desired device.

Patterning the carbon nanotube structure layer into a pattern corresponding to a desired shape by dry etching means that the carbon nanotube structure layer in a region of the surface of the base body other than the region having the pattern corresponding to the desired device receives irradiation of radicals or the like. Methods of irradiation of radicals or the like include one in which the carbon nanotube structure layer in a region other than a region having the pattern is directly irradiated with radicals or the like (C-A-1), and one in which the region other than a region having the pattern is covered with a resist layer and then the entire surface of the base body (of course, on the side where the carbon nanotube structure layer and the resist layer are formed) is irradiated with radicals or the like (C-A-2).

(C-A-1)

Direct irradiation of the carbon nanotube structure layer in a region other than a region having the pattern with radicals or the like specifically means that the carbon nanotube structure layer in a region of the surface of the base body other than the region having the pattern corresponding to the desired device is irradiated with ion beams of gas molecule ions, thereby removing the carbon nanotube structure layer from the irradiated region and patterning the carbon nanotube structure layer into pattern corresponding to the desired device.

In the form of an ion beam, ions of gas molecules can be radiated selectively with precision on the order of several nm. This method is preferable in that the carbon nanotube structure layer can be patterned into a pattern corresponding to a desired device in one operation.

Examples of gas species that can be chosen for the ion beam method include oxygen, argon, nitrogen, carbon dioxide, and hexafluoride. Oxygen is particularly desirable in the present invention.

In the ion beam method, a voltage is applied to gas molecules in vacuum to accelerate and ionize the gas molecules and the obtained ions are radiated in the form of a beam. The ion beam method is capable of etching various substances with varying irradiation accuracy by changing the type of gas used.

(C-A-2)

In the mode in which the regions other than the region having the pattern are covered with a resist layer before the entire surface of the base body is irradiated with radicals or the like, the patterning step includes:

a resist layer forming step (C-A-2-1) of forming a resist layer above the carbon nanotube structure layer in a region on the surface of the base body having the pattern corresponding to the desired device; and a removing step (C-A-2-2) of removing the carbon nanotube structure layer exposed in a region other than the region by subjecting a surface of the base body on which the carbon nanotube structure layer and the resist layer are laminated to dry etching. The patterning step may include:

a resist layer peeling-off step (C-A-2-3) of peeling off the resist layer formed in the resist layer forming step subsequent to the removing step.

(C-A-2-1) Resist Layer Forming Step

In the resist layer forming step, a resist layer is formed above the carbon nanotube structure layer in a region on the surface of the base body having the pattern corresponding to the desired device. This step follows a process generally called a photolithography process and, instead of directly forming a resist layer above the carbon nanotube structure layer in a region having the pattern corresponding to the desired device, a resist layer 16 is once formed on the entire surface of the base body 12 on the side where the carbon nanotube structure layer 14 is formed as shown in FIG. 1(b). Then, the region having the pattern corresponding to the desired device is exposed to light and portions that are not exposed to light are removed through subsequent development. Ultimately, the resist layer is present on the carbon nanotube structure layer in the region having the pattern corresponding to the desired device.

FIG. 1(c) is a schematic sectional view showing a state of the surface of the base body after (C-A-2-1) resist layer forming step. Depending on the type of resist, a portion that is exposed to light is removed by development whereas a portion that is not exposed to light remains.

A known method can be employed to form the resist layer. Specifically, the resist layer is formed by applying a resist agent to the substrate with a spin coater or the like and then heating the applied agent.

There is no particular limitation on the material (resist agent) used to form the resist layer 16, and various known resist materials can be employed without any modification. Employing resin (forming a resin layer) is particularly desirable. The carbon nanotube structure layer 14 has a mesh-like network of carbon nanotubes and is a porous structure. Accordingly, if the resist layer 16 is formed from a metal evaporation film or like other material that forms a film on the very surface and does not infiltrate deep into the holes of the mesh, carbon nanotubes cannot be sealed satisfactorily against radiation of plasma or the like (insufficient sealing means exposure to plasma or the like). As a result, plasma or the like enters from the holes and corrodes the carbon nanotube layer 14 under the resist layer 16, reducing the contour of the carbon nanotube structure layer 14 and leaving only a small portion of the carbon nanotube structure layer 14 due to diffraction of plasma or the like. Although it is possible to give the resist layer 16 a larger contour (area) than the pattern of desired shape taking into account this reduction in size, this method requires a wide gap between patterns and therefore makes it impossible to form patterns close together.

In contrast, when resin is used to form the resist layer 16, the resin enters the spaces inside the holes and reduces the number of carbon nanotubes that are exposed to plasma or the like. As a result, high density patterning of the carbon nanotube structure layer 14 is made possible.

Examples of the resin material that mainly constitutes the resin layer include, but not limited thereto, novolac resin, polymethyl methacrylate, and a mixture of the two.

The resist material for forming the resist layer is a mixture of one of the above resin materials, or a precursor thereof, and a photosensitive material or the like. The present invention can employ any known resist material. For instance, OFPR 800, a product of TOKYO OHKA KOGYO CO., LTD. and NPR 9710, a product of NAGASE & CO., LTD. can be employed.

Appropriate operations or conditions to expose the resist layer 16 to light (heating if the resist material used is thermally curable, a different exposure method is chosen for a different type of resist material) and to develop are selected in accordance with the resist material used. (Examples of exposure and development operations or conditions include the light source wavelength, the intensity of exposure light, the exposure time, the exposure amount, environmental conditions during exposure, the development method, the type and concentration of developer, the development time, and what pre-treatment or post-treatment is to be employed.) When a commercially available resist material is used, the instruction manual for the product should be followed. In general, for conveniences of handling, the layer is exposed to ultraviolet rays to draw the pattern corresponding to the desired device. After that, the film is developed using an alkaline developer, which is then washed off with water, and is let dry to complete the photolithography process.

(C-A-2-2) Removing Step

In the removing step, dry etching is performed on a surface of the base body on which the carbon nanotube structure layer and the resist layer are laminated, thereby removing the carbon nanotube structure layer exposed in a region other than the region. (See FIG. 1(c). The carbon nanotube structure layer 14 is exposed in a region from which the resist layer 16 is removed). FIG. 1(d) is a schematic sectional view showing a state of the surface of the base after (C-A-2-2) removing step.

The removing step can employ every method that is generally called dry etching, including the reactive ion method. The above-described ion beam method in (C-A-1) is one of the dry etching methods.

See the section (C-A-1) for employable gas species, devices, operation environments, and the like.

In the present invention, oxygen is particularly desirable out of examples of gas species generally usable in dry etching which include oxygen, argon, and fluorine-based gas (e.g., chlorofluoro carbon, $SF_6$, and $CF_4$). With oxygen radicals, carbon nanotubes in the carbon nanotube structure layer 14 to be removed are oxidized (burnt) and turned into carbon dioxide. Accordingly, the residue has little adverse effect, and accurate patterning is achieved.

When oxygen is chosen as gas species, oxygen radicals are generated by irradiating oxygen molecules with ultraviolet rays. A device that generates oxygen radicals by means of this method is commercially available by the name of UV washer, and is easy to obtain.

(C-A-2-3) Resist Layer Peeling-Off step

The method of manufacturing a carbon nanotube device of the present invention may end with the completion of (C-A-2-2) removing step, presenting a mode of the carbon nanotube device (the mode shown in FIG. 1(d)). If the resist layer 16 is to be removed, the removing step has to be followed by a resist layer peeling-off step of peeling off the resist layer 16 formed in the resist layer forming step. FIG. 1(e) is a schematic sectional view showing a state of the surface of the base body after (C-A-2-3) resist layer peeling-off step.

An appropriate resist layer peeling-off step operation is chosen in accordance with the material used to form the resist layer 16. When a commercially available resist material is used, the resist layer 16 is peeled off following the instruction manual for the product. When the resist layer 16 is a resin layer, a common removal method is to bring the resin layer into contact with an organic solvent that is capable of dissolving the resin layer.

(C-B)

A mode in which the patterning step includes:

a resist layer forming step of forming a resist layer above the carbon nanotube structure layer in a region on the surface of the base body having the pattern corresponding to the desired device; and a removing step of removing the carbon nanotube structure layer exposed in a region other than the region by bringing a surface of the base body on which the carbon nanotube structure layer and the resist layer are laminated into contact with an etchant.

The mode is a method commonly called wet etching (a method of removing an arbitrary portion using chemical=etchant).

The resist layer forming step in Mode (C-B) is identical with (C-A-2-1) resist layer forming step described above except that a resist material having resistance to the etchant should be used in Mode (C-B). Similar to Mode (C-A) patterning step, the removing step in Mode (C-B) patterning step may be followed by the resist layer peeling-off step and details of this peeling-off step are as described in (C-A-2-3) resist layer peeling-off step. Detailed descriptions of these steps are therefore omitted here.

Reference is made to FIG. 1(c). In the removing step, an etchant is brought into contact with the surface of the base body 12 on which the carbon nanotube structure layer 14 and the resist layer 16 are laminated, thereby removing the carbon nanotube structure layer 14 exposed in a region other than the region.

In the present invention, "bringing an etchant into contact with" is a concept including all operations for bringing a liquid into contact with a subject, and a liquid may be brought into contact with a subject by any methods such as dipping, spraying, and letting a liquid flow over a subject.

The etchant is in general an acid or alkali. Which etchant to choose is determined by the resist material constituting the resist layer 16, the cross-linking structure among carbon nanotubes in the carbon nanotube structure layer 14, and other factors. A desirable etchant is one that etches the resist layer 16 as little as possible and that can easily remove the carbon nanotube structure layer 14.

However, an etchant that etches the resist layer 16 may be employed if it is possible to, by appropriately controlling the temperature and concentration of the etchant and how long the etchant is in contact with the carbon nanotube structure layer, remove the exposed carbon nanotube structure layer 14 before the resist layer 16 is completely etched away.

(D) Other Steps

The carbon nanotube device of the present invention can be manufactured through the above steps. However, the method of manufacturing a carbon nanotube device of the present invention may include additional steps.

For instance, it is preferable to put a surface treatment step for pre-treatment of the surface of the base body before the applying step. The purpose of the surface treatment step is, for example, to enhance the absorption of the cross-linking application liquid to be applied, to enhance the adhesion between the surface of the base body and the carbon nanotube structure layer to be formed thereon as an upper layer, to clean the surface of the base body, or to adjust the electric conductivity of the surface of the base body.

An example of surface treatment for enhancing the absorption of the cross-linking application liquid is treatment by a silane coupling agent (e.g., aminopropyltriethoxysilane or γ-(2-aminoethyl)aminopropyltrimethoxysilane). Surface treatment by aminopropyltriethoxysilane is particularly widely employed and is preferable for the surface treatment step in the present invention. As documented by Y. L. Lyubchenko et al. in "Nucleic Acids Research vol. 21 (1993)" on pages 1117 to 1123, for example, surface treatment by aminopropyltriethoxysilane has conventionally been employed to treat the surface of a mica substrate for use in observation of AFM of DNA.

In the case where two or more carbon nanotube structure layers are to be laminated, the operation of the method of manufacturing a carbon nanotube device of the present invention is repeated twice or more. If an intermediate layer such as a dielectric layer or an insulating layer is to be interposed between carbon nanotube structure layers, a step for forming the layer is inserted in between and then the operation of the method of manufacturing a carbon nanotube device of the present invention is repeated.

In addition, in the case where other layers such as a protective layer and an electrode layer are separately laminated, a step for forming these layers is needed. Each of those layers may be appropriately formed by selecting the material and forming method for the layer depending on a purpose from conventionally known ones or by using a product or method newly developed for the present invention.

Furthermore, various members such as an electrical component, a wiring, a terminal, and an electrode to be added depending on applications of a carbon nanotube device to be obtained, and other constitutions may be appropriately formed by selecting the parts, members, materials, or methods depending on the purpose of the device from conventionally known ones or by using a product or method newly developed for the present invention.

Applied Example of Method of Manufacturing Carbon Nanotube Device Of the Present Invention As described above, an applied example of the method of manufacturing a carbon nanotube device of the present invention includes the following method of manufacturing a carbon nanotube device, characterized by including:

an applying step of applying to a surface of a temporary substrate a solution containing plural carbon nanotubes having functional groups and a cross-linking agent which prompts a cross-linking reaction with the functional groups;

a cross-linking step of mutually cross-linking the plural carbon nanotubes to construct a network structure through curing of the solution after the application to thereby form a carbon nanotube structure layer having the network structure;

a patterning step of patterning the carbon nanotube structure layer into a pattern corresponding to a desired device; and a transferring step of transferring the patterned carbon nanotube structure layer onto a base body.

In the applied example, a portion serving as a base body in the method of manufacturing a carbon nanotube device described above is a temporary substrate. After a carbon nanotube structure layer is once patterned onto the surface of the temporary substrate, the layer is transferred onto a desired base body. In addition, in the transferring step, the patterned carbon nanotube structure layer may be transferred from the temporary substrate to the surface of an intermediate transfer body and then to a desired base body (second base body).

The temporary substrate material that can be used in this applied example is preferably the same as the base body material described in the section titled [Carbon Nanotube Device]. However, a temporary substrate that has at least one flat surface, more desirably, one that is shaped like a flat plate is preferable in consideration of transfer suitability in the transferring step.

To be employable in the applied example, a base body or an intermediate transfer body has to have an adhesive surface holding, or capable of holding, an adhesive. Common tape such as cellophane tape, paper tape, cloth tape, or imide tape can be of course used in the applied example. In addition to the tape and other materials that have plasticity or flexibility, rigid materials may also be employed as a base body or an intermediate transfer body. In the case of a material that does not come with an adhesive, an adhesive is applied to a surface of the material that can hold an adhesive, and then the material can be used in a similar fashion to normal adhesive tape.

Of course, the applied example of the method of manufacturing a carbon nanotube device is particularly effective in the case where a substrate having plasticity or flexibility is used as the base body or the intermediate transfer body. Since it is often difficult to subject a substrate having plasticity or flexibility to the operations of the applying step, the cross-linking step, and the patterning step in terms of its material and handling, it is often difficult to apply the method of manufacturing a carbon nanotube device described above to the substrate. In contrast, according to the applied example, if a substrate made of a material suitable for those operations and having a shape suitable for those operations is chosen as a temporary substrate, the carbon nanotube device of the present invention can be easily manufactured only by finally transferring the carbon nanotube from the temporary substrate without subjecting the substrate having plasticity or flexibility to those operations.

A carbon nanotube device can be also manufactured by: preparing a base body in a state where a carbon nanotube structure layer is carried on the surface of the base body (the state is also included in the category of the carbon nanotube device); and attaching the base body to a desired second base body (for example, a casing) constituting the device.

Alternatively, even when the user skips the cross-linking step, a device can be also manufactured by: using a carbon nanotube transfer body in which a carbon nanotube structure layer is carried on the surface of a temporary substrate (or intermediate transfer body) to transfer only the carbon nanotube structure layer onto the surface of a base body constituting the device; and removing the temporary substrate (or intermediate transfer body). Here, the intermediate transfer body may serve as a temporary substrate of the carbon nanotube transfer body during the process. However, there is no need to distinguish the intermediate transfer body from the carbon nanotube transfer body itself, and hence the case is also included in the present invention.

The use of a carbon nanotube transfer body extremely simplifies the subsequent handling because a carbon nanotube structure layer in a cross-linked state is carried on the surface of a temporary substrate. Therefore, the manufacture of a carbon nanotube device can be performed with extreme ease. A method of removing a temporary substrate can be appropriately selected from simple peeling, chemical decomposition, burnout, melting, sublimation, dissolution, and the like.

In the applied example of the method of manufacturing a carbon nanotube device, the operations of the applying step, the cross-linking step, and the patterning step are the same as those of the method of manufacturing a carbon nanotube device described above except that a target of application, curing, patterning, and the like is changed from a base body to a temporary substrate. The applied example is different from the method of manufacturing a carbon nanotube device in that the operation of the transferring step is performed subsequently to the patterning step. Hereinafter, the transferring step will be described with reference to FIG. 2.

FIG. 2 are schematic sectional diagrams of the surfaces of a temporary substrate and a base body during the manufacturing process for explaining an example of the applied example of the method of manufacturing a carbon nanotube device. In the figures, reference numeral 22 denotes a temporary substrate; 24, a carbon nanotube structure layer; and 28, a base body. The carbon nanotube structure layer 24 has the same structure as that of the carbon nanotube structure layer 14 shown in FIG. 1.

First, through the operations of the applying step, the cross-linking step, and the patterning step, a product shown in FIG. 2(*a*) is prepared, in which the carbon nanotube structure layer 24 is formed on the surface of the temporary substrate 22.

Next, as shown in FIG. 2(*b*), the base body 28 such as an adhesive tape is prepared. Then, the base body 28 is moved in the direction indicated by an arrow X with its adhesive surface facing toward the side of the temporary substrate 22 on which the carbon nanotube structure layer 24 is formed to attach them to each other as shown in FIG. 2(*c*).

Then, as shown in FIG. 2(*d*), the base body 28 is moved in the direction indicated by an arrow Y to be peeled off from the temporary substrate 22 on which the carbon nanotube structure layer 24 is formed. As a result, the carbon nanotube structure layer 24 formed on the surface of the temporary substrate 22 is transferred onto the adhesive surface of the base body 28.

Thus, the carbon nanotube structure layer 24 is patterned onto the base body 28 through the temporary substrate 22, so that the carbon nanotube device of the present invention is manufactured.

The applied example of the method of manufacturing a carbon nanotube device is particularly effective in the case where a base body of a device has a material and/or shape that make it difficult to apply the method of manufacturing a carbon nanotube device of the present invention without some changes.

For instance, the applied example of the present invention is effective in the case where the temperature at which the solution after the application is cured in the cross-linking step is equal to or higher than the melting point or glass transition point of the material that is to be used as a base body of the device. In this case, the heating temperature is set lower than the melting point of the temporary substrate to ensure a heating temperature necessary for the curing, and thus the carbon nanotube device of the present invention can be manufactured appropriately.

Specifics on temperatures, materials, and the like vary depending on the heating temperature. Resin materials such as polyethylene, polypropylene, polyvinyl chloride, polyamide, and polyimide, and various materials containing resin materials and each having plasticity or flexibility have relatively low melting points and low glass transition points. Therefore, limitations brought by a low melting point or a low glass transition point are lifted by employing this applied example (application of the applied example) in which any one of such materials is used as the base body. Therefore, application of any one of those resin materials to the transfer body is preferable because the merits of the applied example are brought out. On the other hand, an inorganic material such as silicon, zinc oxide, or sapphire is suitable for the temporary substrate because of its relatively low melting point.

To give another example, the applied example of the present invention is effective also when the patterning step takes a mode in which dry etching is performed on the carbon nanotube structure layer in a region of the surface of the temporary substrate other than the region having the pattern corresponding to the desired device, thus removing the carbon nanotube structure layer in the region and patterning the carbon nanotube structure layer into a pattern corresponding to the desired device while the material that is to be used as a base body of the device has no resistance to dry etching of the patterning step. In this case, a material having resistance to dry etching is used as the temporary substrate so that the resistance to the operation of the step of patterning on the temporary substrate can be ensured, and thus the carbon nanotube device of the present invention can be manufactured appropriately.

Although specifics on resistance and material vary depending on dry etching conditions including gas species, intensity, time, temperature, and pressure, resin materials have relatively low resistance to dry etching. When a resin material is used as the base body, limitations brought by low resistance of the resin material are lifted by employing this applied example. Therefore, forming the base body from a resin material is preferable in that merits of the applied example are brought out. On the other hand, inorganic materials which have relatively high resistance to dry etching are suitable for the temporary substrate. In general, plastic or flexible materials have low resistance to dry etching and therefore using one of such materials as the base body is preferable in that merits of this applied example are brought out.

To give another example, the applied example of the present invention is effective also in the case where the patterning step includes: a resist layer forming step of forming a resist layer above the carbon nanotube structure layer in a region on the surface of the temporary substrate having the pattern corresponding to the desired device; and a removing step of removing the carbon nanotube structure layer exposed in a region other than the region by bringing a surface of the temporary substrate on which the carbon nanotube structure layer and the resist layer are laminated into contact with an etchant, and the base body has no resistance to the etchant used in the patterning step, but the temporary substrate has resistance to the etchant. In this case, the base body in this applied example serves as a base body of the device and a material having resistance to the etchant is used as the temporary substrate so that the resistance to the operation of the step of patterning onto the temporary substrate can be ensured. Thus, the carbon nanotube device of the present invention can be manufactured appropriately.

Specifics on resistance and material vary depending on etching conditions including the type, concentration, and temperature of the etchant used, how long the etchant is in contact with the carbon nanotube structure layer, and the like. When an acidic etchant is used and a base body of the device is to be formed from aluminum or like other materials that do not withstand acid, for example, limitations brought by low resistance of the base body material are lifted by employing the applied example and using silicon or other materials having resistance to acid as the temporary substrate. Limitations brought by low resistance are also lifted by using as the base body a material that has low resistance to an etchant as described above although depending on whether the etchant is acidic or alkaline.

As another mode, for making the carbon nanotube device of the present invention easy to handle even more, a base body that carries the carbon nanotube structure layer 24 may be pasted onto a second base body to constitute the carbon nanotube device of the present invention or an apparatus using the same. The second base body may be physically rigid or may be plastic or flexible, and can take various shapes including a spherical shape and a concave-convex shape.

More Specific Example

A more specific description of the present invention is given below through Examples. However, the present invention is not limited to the following examples.

A carbon nanotube device was manufactured through a flow of the method of manufacturing a carbon nanotube device shown in FIG. 1. It should be noted that reference numerals in FIG. 1 may be used in the description of this example.

(A) Applying Step (A-1) Preparation of Cross-Linking Application Liquid (Addition Step)

Figure 3:
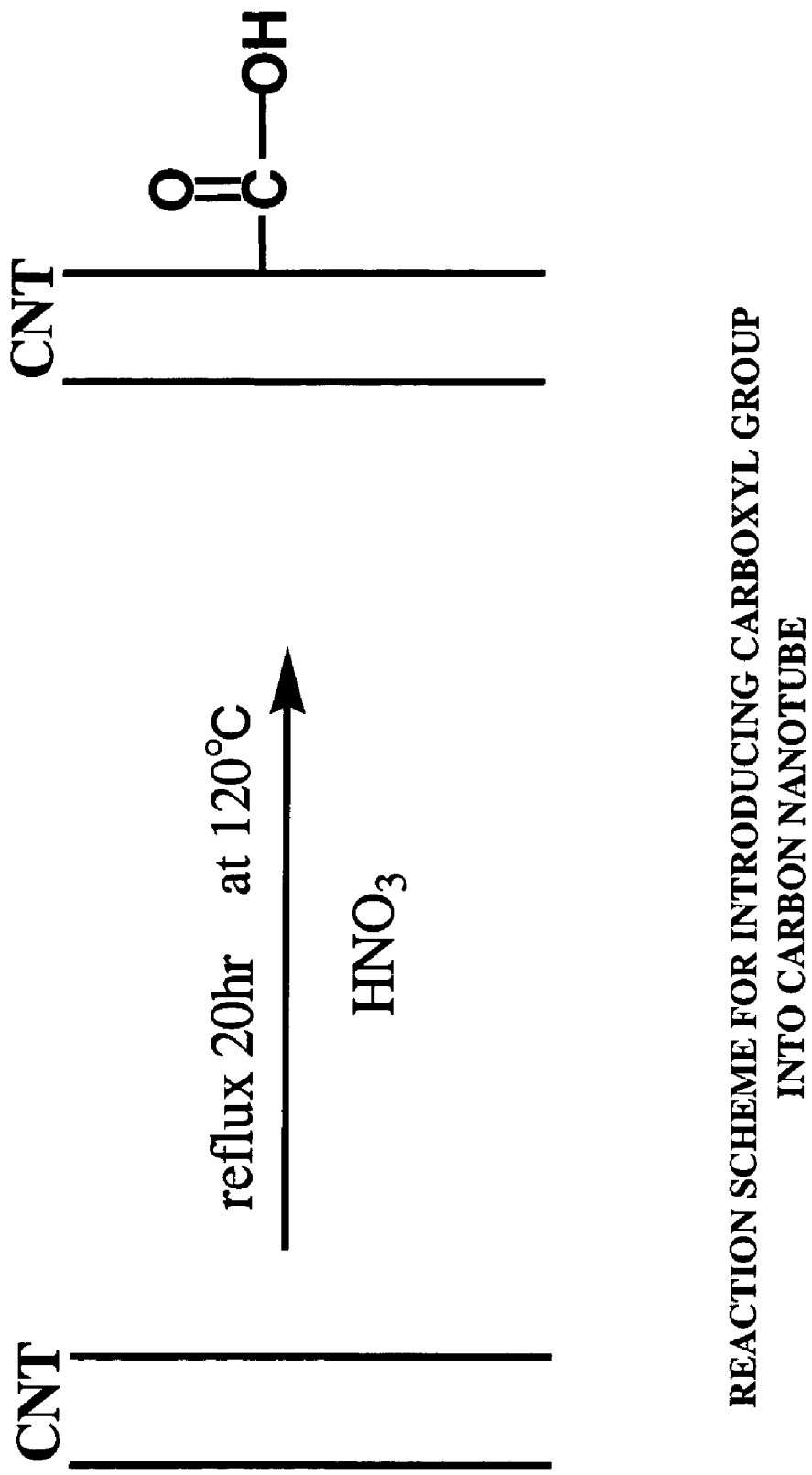
FIG. 3 is a reaction scheme for the synthesis of a carbon nanotube carboxylic acid in (Addition Step) of Example 1.

(1) Addition of Carboxyl Group . . . Synthesis of Carbon Nanotube Carboxylic Acid 30 mg of multi-wall carbon nanotube powder (purity: 90%, average diameter: 30 nm, average length: 3 µm, available from Science Laboratory Inc.) were added to 20 ml of concentrated nitric acid (a 60 mass % aqueous solution, available from KANTO KAGAKU) for reflux at 120° C. for 20 hours to synthesize a carbon nanotube carboxylic acid. A reaction scheme of the above is shown in FIG. 3. In FIG. 3, a carbon nanotube (CNT) is represented by two parallel lines (same applies for other figures relating to reaction schemes).

The temperature of the solution was returned to room temperature and the solution was subjected to centrifugal separation at 5,000 rpm for 15 minutes to separate supernatant liquid from precipitate. The recovered precipitate was dispersed in 10 ml of pure water, and the dispersion liquid was subjected to centrifugal separation again at 5,000 rpm for 15 minutes to separate supernatant liquid from precipitate (the above process constitutes one washing operation). This washing operation was repeated five more times and lastly precipitate was recovered.

An infrared absorption spectrum of the recovered precipitate was measured. An infrared absorption spectrum of the used multi-wall carbon nanotube raw material itself was also measured for comparison. A comparison between both the spectra revealed that absorption at 1,735 cm$^{-1}$ characteristic of a carboxylic acid, which was not observed in the multi-wall carbon nanotube raw material itself, was observed in the precipitate. This finding shows that a carboxyl group was introduced into a carbon nanotube by the reaction with nitric acid. In other words, this finding confirmed that the precipitate was a carbon nanotube carboxylic acid.

Addition of the recovered precipitate to neutral pure water confirmed that dispersability was good. This result supports the result of the infrared absorption spectrum that a hydrophilic carboxyl group was introduced into a carbon nanotube.

Figure 4:
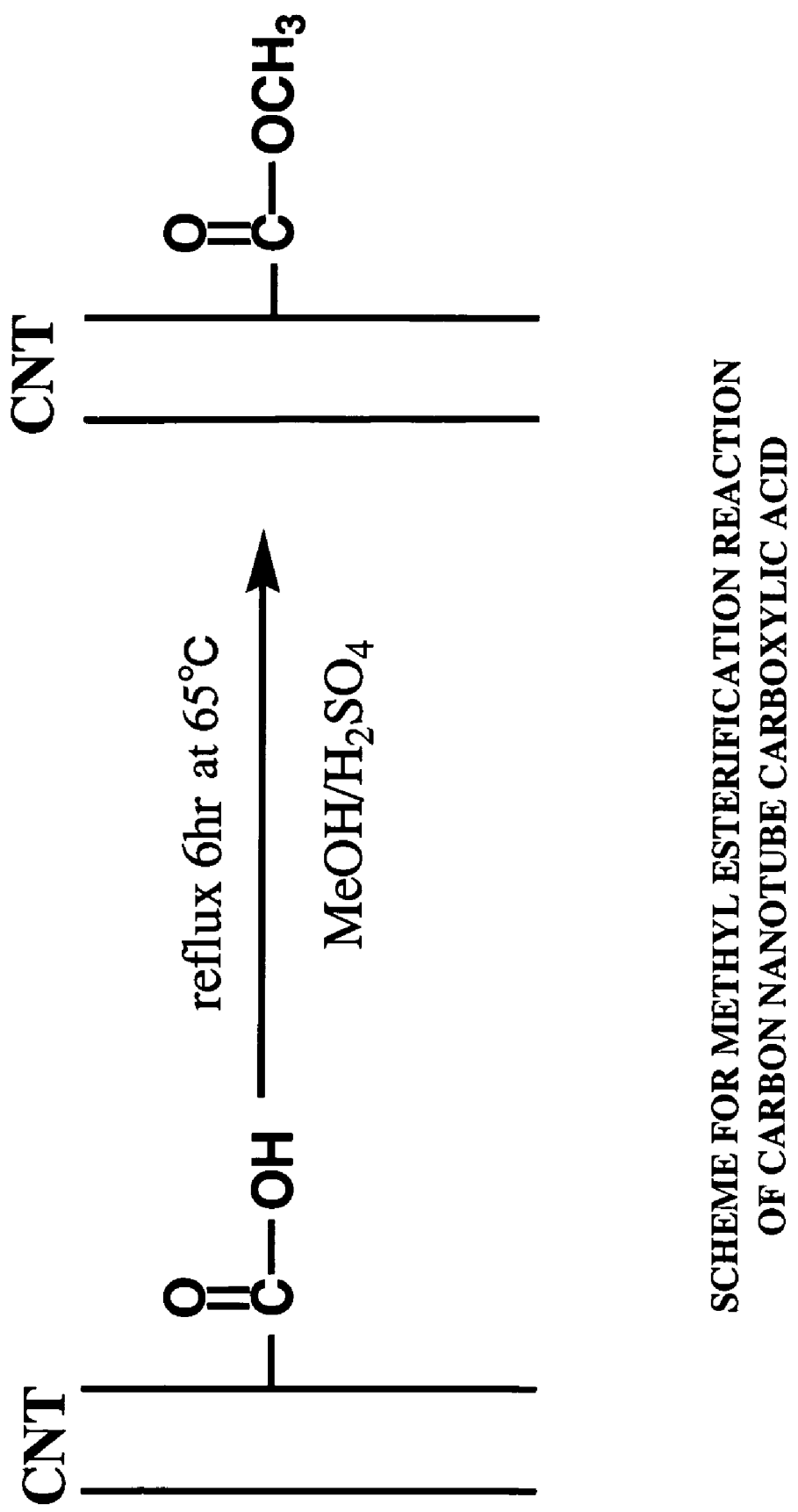
FIG. 4 is a reaction scheme for esterification in (Addition Step) of Example 1.

(2) Esterification 30 mg of the carbon nanotube carboxylic acid prepared in the above step were added to 25 ml of methanol (available from Wako Pure Chemical Industries, Ltd.). Then, 5 ml of concentrated sulfuric acid (98 mass %, available from Wako Pure Chemical Industries, Ltd.) were added to the mixture, and reflux was conducted at 65° C. for 6 hours for methyl esterification. The reaction scheme for the above-mentioned methyl esterification is shown in FIG. 4.

After the temperature of the solution had been recovered to room temperature, the solution was filtered to separate a precipitate. The precipitate was washed with water, and was then recovered. An infrared absorption spectrum of the recovered precipitate was measured. As a result, absorption at 1,735 $cm^{-1}$ and that in the range of 1,000 to 1,300 $cm^{-1}$ characteristic of ester were observed. This result confirmed that the carbon nanotube carboxylic acid was esterified.

Mixing Step 30 mg of the carbon nanotube carboxylic acid methyl esterified in the above step were added to 4 g of glycerin (available from KANTO KAGAKU) and the whole was mixed using an ultrasonic disperser. Further, the mixture was added to 4 g of methanol as a viscosity adjuster to prepare a cross-linking application liquid (1).

(A-2) Surface Treatment Step of Base Body

Prepared was a silicon wafer (available from Advantech Co., Ltd, 76.2 mmφ (diameter of 3 inches), thickness of 380 μm, thickness of a surface oxide film of 1 μm) as the base body 12. The silicon wafer was subjected to surface treatment using aminopropyltriethoxysilane for enhancing adsorption of the silicon wafer with respect to the cross-linking application liquid (1) to be applied to the wafer.

The silicon wafer was subjected to the surface treatment using aminopropyltriethoxysilane by exposing the silicon wafer to steam of 50 μl of aminopropyl triethoxysilane (available from Sigma-Aldrich Co.) for about 3 hours in a closed Schale.

For comparison, a silicon wafer which had not been subjected to surface treatment was also separately prepared.

(A-3) Applying Step

The cross-linking application liquid (1 μl) prepared in Step (A-1) was applied to the surface of the silicon wafer subjected to the surface treatment by using a spin coater (1H-DX2, manufactured by MIKASA Co., Ltd.) at 100 rpm for 30 seconds. The solution was similarly applied to the silicon wafer for comparison which had not been subjected to the surface treatment.

(B) Cross-Linking Step

Figure 5:
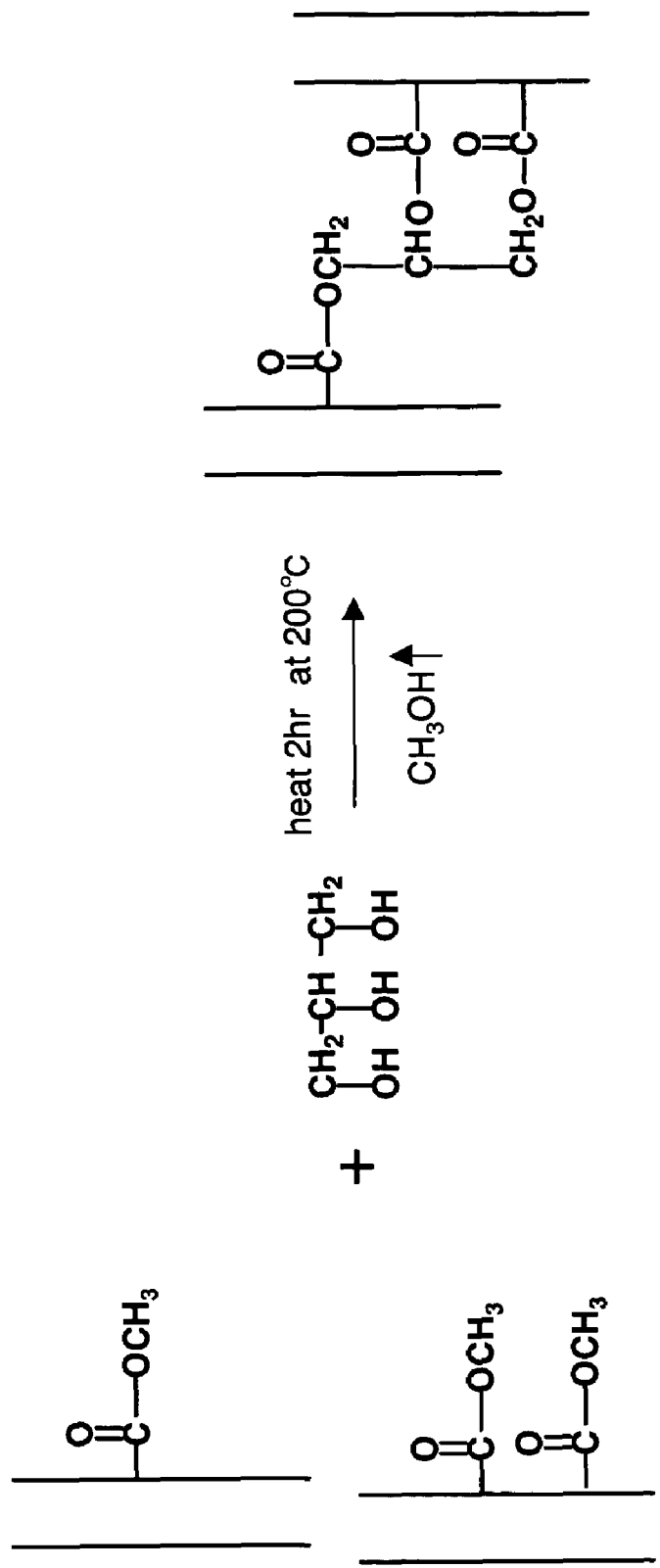
FIG. 5 is a reaction scheme for cross-linking by an ester exchange reaction in (Cross-linking Step) of Example 1.

After the application of the cross-linking application liquid, the silicon wafer on which the applied film had been formed (base body 12) was heated at 200° C. for 2 hours to cure the applied film, thereby forming the carbon nanotube structure layer 14 (FIG. 1(a)). For comparison, the applied film of the silicon wafer for comparison which had not been subjected to the surface treatment was similarly cured. FIG. 5 shows the reaction scheme.

The observation of the state of the obtained carbon nanotube structure layer 14 by means of an optical microscope confirmed an extremely uniform cured film. In contrast, the observation of the state of the carbon nanotube structure formed on the silicon wafer for comparison which had not been subjected to the surface treatment similarly by means of an optical microscope confirmed a sufficiently uniform cured film, which was slightly inferior to that of the silicon wafer subjected to the surface treatment.

Figure 6:
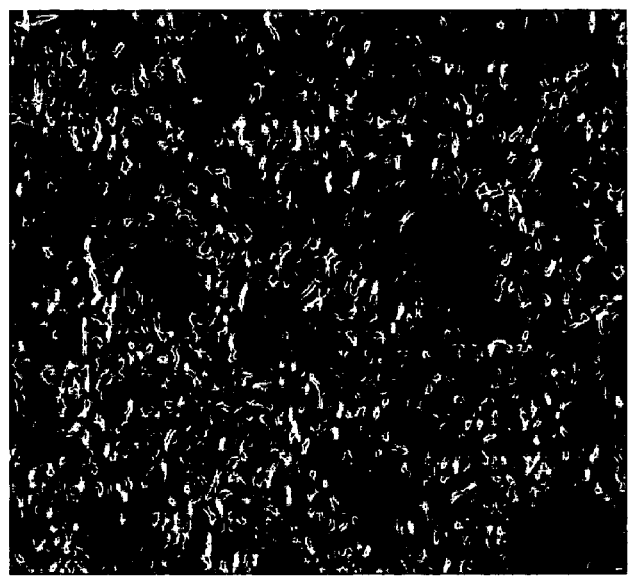
FIG. 6 is an optical micrograph (2,500-fold magnification) showing a carbon nanotube structure layer obtained through (Cross-linking Step) of Example 1.

FIG. 6 shows an optical micrograph (at a magnification of 2,500) of the carbon nanotube structure layer 14 formed on the silicon wafer subjected to the surface treatment. The magnification of the photograph has some degree of error depending on the degree of enlargement of the photograph, and the like.

(C) Patterning Step (C-1) Resist Layer Forming Step

A resist agent (available from Nagese & Co., LTD, NPR9710, viscosity of 50 mPa·s) was applied to the side of the carbon nanotube structure layer 14 of the silicon wafer 12 (subjected to surface treatment) on which the carbon nanotube structure layer 14 had been formed by using a spin coater (manufactured by Mikasa, 1H-DX2) at 2,000 rpm for 20 seconds. Then, the applied agent was heated at 100° C. for 2 minutes to form a film, thereby forming the resist layer 16 (FIG. 1(b)).

The resist agent NPR9710 had the following composition.
Propylene glycol monomethyl ether acetate: 50 to 80 mass %
Novolad resin: 20 to 50 mass %
Photosensitive agent: less than 10 mass %

Figure 7:
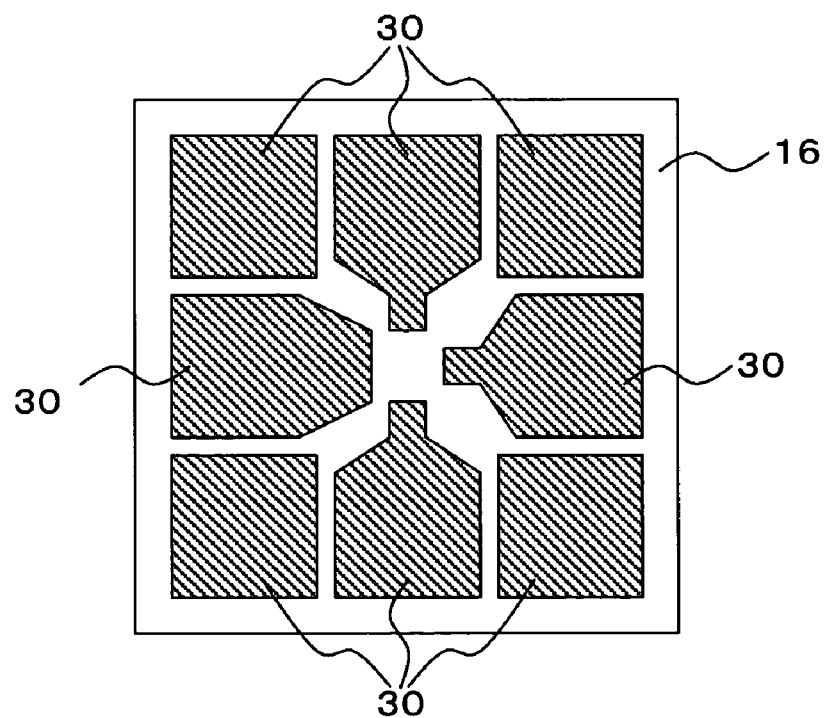
FIG. 7 is an enlarged plan view for explaining a shape of a resist layer to be left in the patterning step of Example 1, when viewed from the side of a resist layer of a silicon wafer on which a carbon nanotube structure layer and the resist layer are formed.

The surface on the side of the resist layer 16 of the silicon wafer 12 on which the carbon nanotube structure layer 14 and the resist layer 16 were formed was exposed to light to have a shape shown in FIG. 7 by using a mask aligner (mercury vapor lamp manufactured by Mikasa, MA-20, wavelength of 436 nm). Here, FIG. 7 is an enlarged plan view for explaining a shape of the resist layer to be remained, when viewed from the side of the resist layer 16 of the silicon wafer 12 on which the carbon nanotube structure layer 14 and the resist layer 16 were formed. Reference numeral 30 denotes an exposed portion on the surface of the resist layer 16. The exposed portion 30 has a shape of the "predetermined pattern" (electrode shape) in this example.

Furthermore, the exposed silicon wafer 12 was heated on a hot plate at 110° C. for 1 minute. Then, the silicon wafer was left to stand to cool, and development was performed on a developing machine (AD-1200, Takizawa Industries) by using as a developer NMD-3 available from TOKYO OHKA KOGYO CO., LTD (tetramethyl ammonium hydroxide 2.38 mass %). At this time, an optical microscope was used to confirm that the resist layer 16 was formed into a shape of the predetermined pattern (shape of the exposed portion 30 in FIG. 7).

(C-2) Removing Step

The silicon wafer 12 on which the resist layer 16 was thus formed into the shape of the predetermined pattern was heated in a mixed gas (oxygen 10 mL/min, nitrogen 40 mL/min) at 200° C. and irradiated with ultraviolet rays (172 nm) for 5 hours by using a UV usher (excimer vacuum ultraviolet lamp, manufactured by Atom Giken, EXM-2100BM, wavelength of 172 nm) to generate oxygen radicals, thereby removing a portion of the carbon nanotube structure layer 14 which was not protected by the resist layer 16. As a result, as shown in FIG. 8, the carbon nanotube structure layer 14 was formed into the shape of the "predetermined pattern" (FIG. 1(*d*)) in a state of being covered with the resist layer 16.

Figure 8:
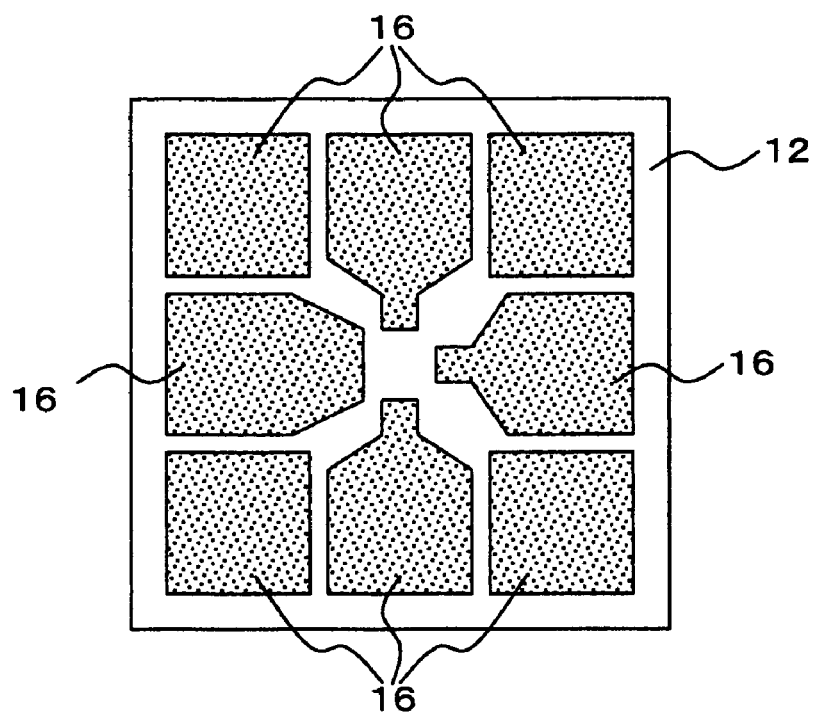
FIG. 8 is an enlarged plan view when viewed from the side of the resist layer of the silicon wafer after the removing step in Example 1.

Here, FIG. 8 is an enlarged plan view when viewed from the side of the resist layer 16 of the silicon wafer 12 after the removing step. The resist layer 16 remains on the surface of the base body 12 through the carbon nanotube structure layer 14 not appearing in the figure.

(C-3) Resist Layer Peeling-Off Step

The resist layer 16 remaining as an upper layer of the carbon nanotube structure layer 14 formed into the shape of the "predetermined pattern" was removed by washing it with acetone (FIG. 1(*e*)) to obtain a carbon nanotube device of Example 1. The carbon nanotube device can function as it is as a printed board.

Figure 9:
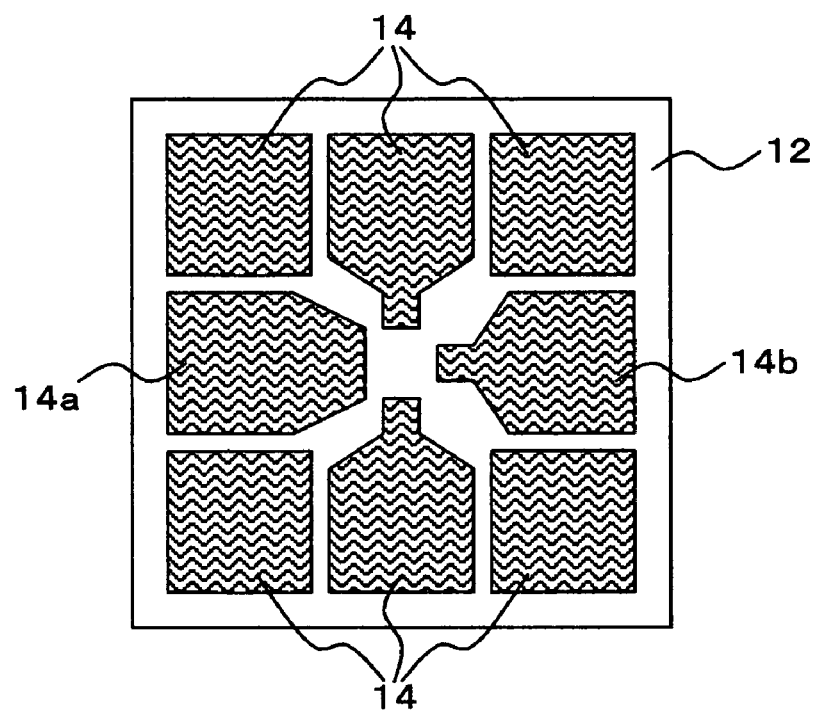
FIG. 9 is an enlarged plan view showing the surface of the carbon nanotube device of Example 1.

The surface of the resultant carbon nanotube device was observed with an optical microscope. As a result, as shown in FIG. 9, the carbon nanotube structure layer 14 (including 14*a* and 14*b*, the same holds true for the following description unless otherwise specified) was formed into the shape of the "predetermined pattern". Here, FIG. 9 is an enlarged view of the resultant carbon nanotube device.

The thickness of the carbon nanotube structure layer 14 of the obtained carbon nanotube device of Example 1 was measured with a surface shape measuring instrument Dektak3030 (manufactured by Japan Vacuum Technology Co., Ltd). The thickness was 500 nm.

Next, DC current-voltage characteristic measurement was performed according to a two-terminal method by using a Picoammeter 4140B (manufactured by Hewlett-Packard Development Company, LP) to determine the DC conductivity of the carbon nanotube structure layer 14 in the obtained carbon nanotube device of Example 1. As a result, the conductivity was 17 S·cm$^{-1}$.

Example 2

Figure 10:
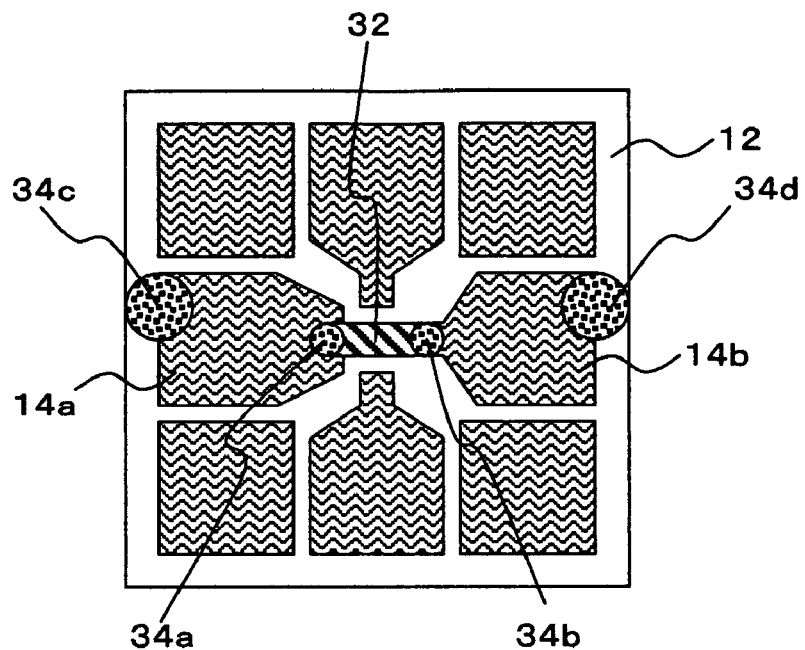
FIG. 10 is an enlarged plan view showing the surface of a carbon nanotube device of Example 2.

As shown in FIG. 10, an LED (manufactured by Stanley Electric Co., Ltd., DB1111C) 32 was mounted onto the carbon nanotube structure layers 14 (opposing end portions of 14*a* and 14*b* in FIG. 9) functioning as electrodes in the carbon nanotube device obtained in Example 1 with silver pastes 34*a* and 34*b*.

In addition, a lead wire (not shown) to be connected to a power supply device (not shown) was connected to the other end portions of the carbon nanotube structure layers 14*a* and 14*b* with silver pastes 34*c* and 34*d*, and the resultant was provided as an electrode terminal, thereby obtaining a carbon nanotube device of Example 2. Here, FIG. 2 is an enlarged plan view of the surface of the carbon nanotube device of Example 2.

A voltage was applied to the electrode terminal with the power supply device, with the result that the LED 32 lighted up at 3.3 V. The result confirmed that circuit formation was performed.

Comparative Example 1

10 mg of multi-wall carbon nanotube powder (purity: 90%, average diameter: 30 nm, average length: 3 μm, available from Science Laboratory Inc.) were dispersed in 20 g of isopropyl alcohol. The resultant dispersion liquid had extremely poor dispersability and could not hold characteristics of a paint.

About 0.1 ml of the resultant dispersion liquid was dropped and developed onto the same silicon wafer as that in Example 1 with a Pasteur pipette, and was heated at about 100° C. for 10 minutes to provide a deposit of multi-wall carbon nanotubes which were not cross-linked (a carbon nanotube device of Comparative Example 1). The observation of the obtained deposit at a magnification of 10 to 20 confirmed that the deposit was separated in an insular fashion as an agglomerate and showed no film shape. The result revealed that the dispersion liquid or deposit of this comparative example containing no cross-linking structure is poor in film formability and cannot function as a paint or an applied film.

Verification Test

The carbon nanotube device of Example 1 and the deposit obtained in Comparative Example 1 (the carbon nanotube device of Comparative Example 1) were compared with respect to electric conductivity characteristics. For both cases, a carbon nanotube structure layer or a deposit layer was formed on an SiO$_2$/Si substrate to have a thickness of about 1 μm in the same manner as in each of Example and Comparative Example, and the resultant was subjected to this verification test.

Figure 11:
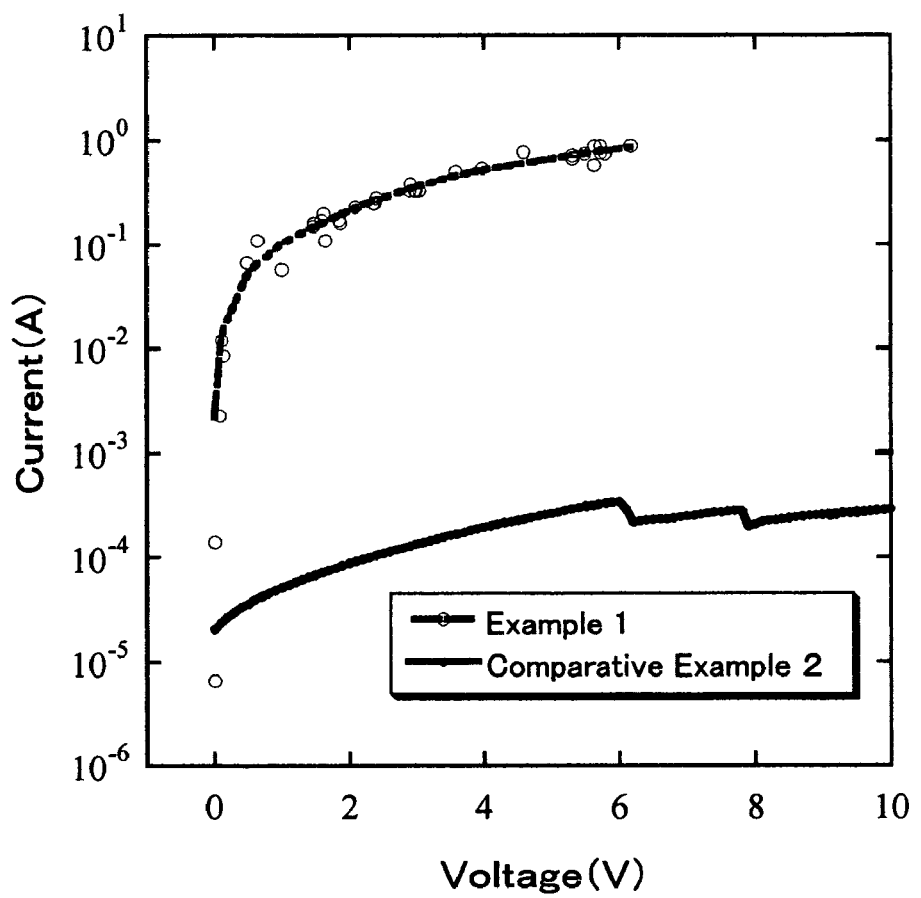
FIG. 11 is a graph showing current-voltage characteristic measurements for the carbon nanotube structure layer formed in Example 1 and a layer of a deposit formed in Comparative Example 1.

Two gold electrodes were deposited from the vapor onto each of the formed layers at a gap interval of 350 μm, and then the DC conductivity was measured according to the two-terminal method by using a Picoammeter 4140B (manufactured by Hewlett-Packard Development Company, LP). FIG. 11 shows the current-voltage characteristic measurements. A current of about 0.8 A flowed at 5 V in Example 1, whereas a current of about $3\times10^{-4}$ A flowed in Comparative Example 1. It was found that a current 3 or more orders of magnitude larger than that of Comparative Example 1 can flow in Example 1.

It was also found that, in Comparative Example 1, the current exhibited a sharp drop when a current up to about $6.4\times10^{-4}$ A (6.0 V) was caused to flow. This is probably because a resistance in a portion where carbon nanotubes overlap each other, the resistance being caused by the fact that the carbon nanotubes are not chemically bonded unlike the carbon nanotube structure layer in Example 1, generates heat to cut part of electrical connections due to overlap of carbon nanotubes.

Example 3

A carbon nanotube device was manufactured according to the flow of the method of manufacturing a carbon nanotube device shown in FIG. 2 (applied example). In some cases, reference numerals in FIG. 2 are used in the description of this example.

(A) Applying Step, (B) Cross-Linking Step, and (C) Patterning Step

The operations of (A) Applying Step, (B) Cross-linking Step, and (C) Patterning Step were performed in the same manner as in Example 1 to prepare a product in a state shown in FIG. 2(*a*). In this example, the silicon wafer used in Example 1 corresponds to the temporary substrate 22, and a product formed in a predetermined pattern (shape of the carbon nanotube structure layer 14 of FIG. 9) on the surface of the temporary substrate 22 corresponds to the carbon nanotube structure layer 24.

(D) Transferring Step

In the silicon wafer on which the carbon nanotube structure layer 24 had been formed, an adhesive surface of an imide tape (available from Permacel, 19 mm×40 mm, thickness of 30 μm, heat resistant temperature of 180° C.) was horizontally attached to the surface on the side of the carbon nanotube structure layer 24 of the temporary substrate 22. A glass plate was placed on the imide tape, and a pressure was applied to the entire surface of the carbon nanotube structure layer 24 for contact bonding (FIGS. 2(b) and 2(c)).

After that, the imide tape was peeled off from the silicon wafer 12 to transfer the carbon nanotube structure layer 24 onto the imide tape. The resultant (carbon nanotube transfer body) had the same constitution as that of the carbon nanotube device of Example 1 (FIG. 9) except that the base body was the imide tape.

Figure 12:
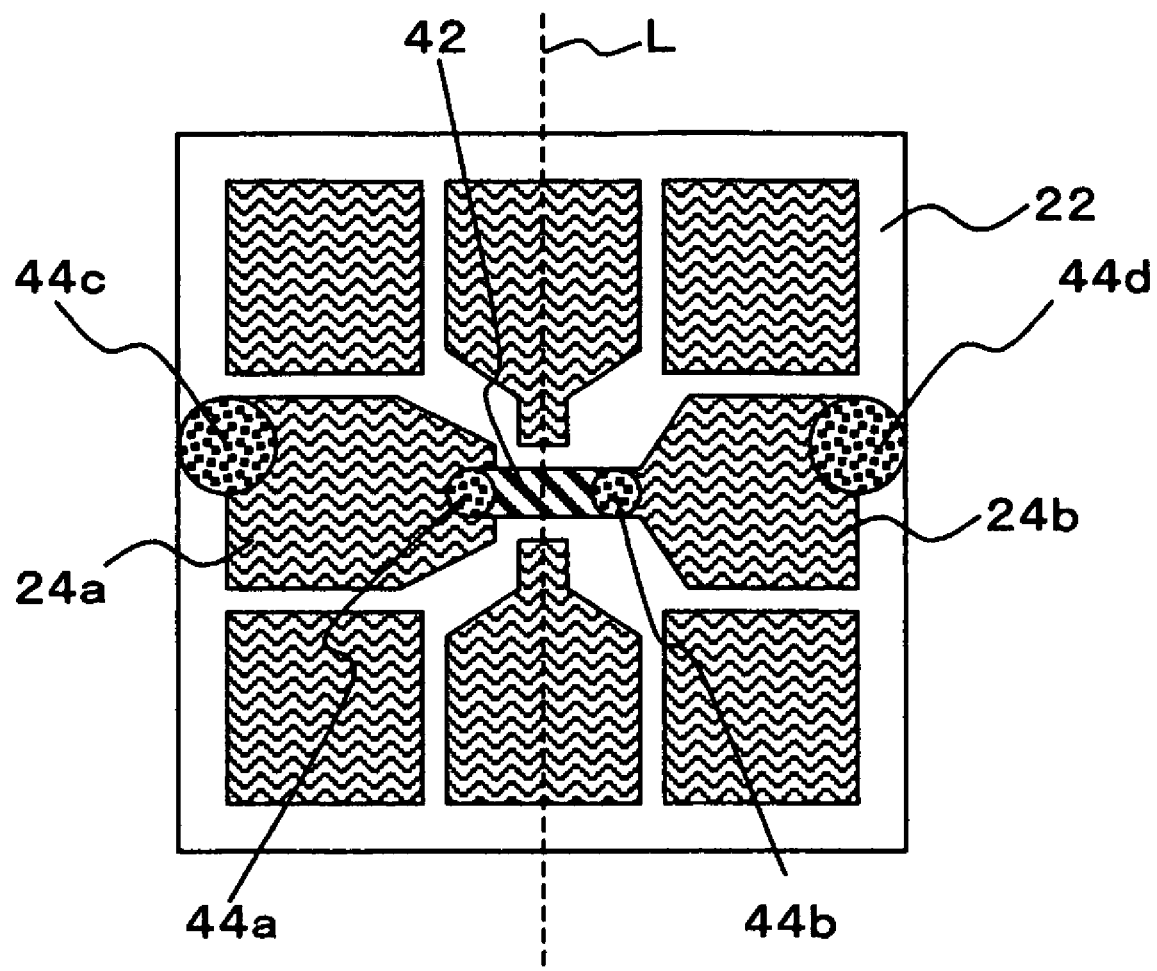
FIG. 12 is an enlarged plan view showing the surface of a carbon nanotube device of Example 3.

The resultant carbon nanotube transfer body was attached to an OHP sheet (second base body) together with the imide tape with the surface onto which the carbon nanotube structure layer had been transferred facing upward. Then, as in Example 2, an LED (manufactured by Stanley Electric Co., Ltd., DB1111C) 42 was mounted onto the sheet with silver pastes 44a and 44b. A lead wire (not shown) to be connected to a power supply device (not shown) was connected with silver pastes 44c and 44d, and the resultant was provided as an electrode terminal, thereby obtaining a carbon nanotube device of Example 3 structured as shown in FIG. 12. Here, FIG. 12 is an enlarged plan view of the surface of the carbon nanotube device of Example 3.

A voltage was applied to the electrode terminal with the power supply device, with the result that the LED 42 lighted up at 10 V. The result confirmed that circuit formation was performed. In addition, the carbon nanotube device was bent by 180° with a portion indicated by a broken line L in FIG. 12 as an apex with a radius R of 10 mm. After that, a voltage was applied in the same manner as that described above, with the result that the LED 42 lighted up at 10 V despite the fact that the carbon nanotube device was bent. The result confirmed that the carbon nanotube device of this example is rich in flexibility.

As described above, according to the present invention, there can be provided a carbon nanotube device capable of efficiently exerting various electrical or physical characteristics of a carbon nanotube and a method of manufacturing the same. In particular, according to the present invention, there can be provided a carbon nanotube device capable of arranging a metal wiring or electrical component which is fine and has an arbitrary shape on the surface of a base body such as a substrate, and a method of manufacturing the same.

The invention claimed is:

1. A method of manufacturing a carbon nanotube device, characterized by comprising:
    an applying step of applying to a surface of a base body a solution containing plural carbon nanotubes having functional groups and a cross-linking agent which prompts a cross-linking reaction with the functional groups;
    a cross-linking step of mutually cross-linking the plural carbon nanotubes to construct a network structure through curing of the solution after the application to thereby form a carbon nanotube structure layer having the network structure; and
    a patterning step of patterning the carbon nanotube structure layer into a pattern corresponding to a desired device.

2. A method of manufacturing a carbon nanotube device according to claim 1, characterized in that the cross-linking agent comprises a not-self-polymerizable cross-linking agent.

3. A method of manufacturing a carbon nanotube device according to claim 1, characterized in that the patterning step comprises a step in which the carbon nanotube structure layer in a region on the surface of the base body other than a pattern corresponding to the desired device is subjected to dry etching to remove the carbon nanotube structure layer in the region, whereby the carbon nanotube structure layer is patterned into a pattern corresponding to the desired device.

4. A method of manufacturing a carbon nanotube device according to claim 1, characterized in that the patterning step includes:
    a resist layer forming step of forming a resist layer above the carbon nanotube structure layer in a region on the surface of the base body having the pattern corresponding to the desired device; and
    a removing step of removing the carbon nanotube structure layer exposed in a region other than the region by subjecting a surface of the base body on which the carbon nanotube structure layer and the resist layer are laminated to dry etching.

5. A method of manufacturing a carbon nanotube device according to claim 4, characterized in that, in the removing step, the surface of the base body on which the carbon nanotube structure layer and the resist layer are laminated is irradiated with an oxygen molecule radical.

6. A method of manufacturing a carbon nanotube device according to claim 4, characterized in that oxygen molecules are irradiated with ultraviolet rays to generate an oxygen molecule radical, which is used as a radical with which the surface of the base body on which the carbon nanotube structure layer and the resist layer are laminated is irradiated.

7. A method of manufacturing a carbon nanotube device according to claim 4, characterized in that the patterning step further includes a resist layer peeling-off step of peeling off the resist layer formed in the resist layer forming step subsequent to the removing step.

8. A method of manufacturing a carbon nanotube device according to claim 4, characterized in that the resist layer comprises a resin layer.

9. A method of manufacturing a carbon nanotube device according to claim 1, characterized in that the patterning step comprises a step of patterning the carbon nanotube structure layer into the pattern corresponding to the desired device by selectively irradiating the carbon nanotube structure layer in a region of the surface of the base body other than the region having the pattern corresponding to the desired device with an ion beam of a gas molecule to remove the carbon nanotube structure layer in the region.

10. A method of manufacturing a carbon nanotube device according to claim 1, characterized in that the patterning step includes:
    a resist layer forming step of forming a resist layer above the carbon nanotube structure layer in a region on the surface of the base body having the pattern corresponding to the desired device; and
    a removing step of removing the carbon nanotube structure layer exposed in a region other than the region by bringing a surface of the base body on which the carbon nanotube structure layer and the resist layer are laminated into contact with an etchant.

11. A method of manufacturing a carbon nanotube device according to claim 1, characterized in that:
    the functional groups comprise at least one functional group selected from the group consisting of —OH, —COOH, —COOR (where R represents a substituted or unsubstituted hydrocarbon group), —COX (where X represents a halogen atom), —NH$_2$, and —NCO; and the cross-linking agent comprises a cross-linking agent capable of prompting a cross-linking reaction with the selected functional groups.

12. A method of manufacturing a carbon nanotube device according to claim 1, characterized in that:
  the cross-linking agent comprises at least one cross-linking agent selected from the group consisting of a polyol, a polyamine, a polycarboxylic acid, a polycarboxylate, a polycarboxylic acid halide, a polycarbodiimide, and a polyisocyanate; and
  the functional groups comprise functional groups capable of prompting a cross-linking reaction with the selected cross-linking agent.

13. A method of manufacturing a carbon nanotube device according to claim 1, characterized in that:
  the functional groups comprise at least one functional group selected from the group consisting of —OH, —COOH, —COOR (where R represents a substituted or unsubstituted hydrocarbon group), —COX (where X represents a halogen atom), —NH$_2$, and —NCO;
  the cross-linking agent comprises at least one cross-linking agent selected from the group consisting of a polyol, a polyamine, a polycarboxylic acid, a polycarboxylate, a polycarboxylic acid halide, a polycarbodiimide, and a polyisocyanate; and
  the functional groups and the cross-linking agent are respectively selected for a combination capable of prompting a mutual cross-linking reaction.

14. A method of manufacturing a carbon nanotube device according to claim 1, characterized in that the functional groups comprise —COOR (where R represents a substituted or unsubstituted hydrocarbon group).

15. A method of manufacturing a carbon nanotube device according to claim 14, characterized in that the cross-linking agent comprises a polyol.

16. A method of manufacturing a carbon nanotube device according to claim 14, characterized in that the cross-linking agent comprises glycerin and/or ethylene glycol.

17. A method of manufacturing a carbon nanotube device according to claim 1, characterized in that solution further contains a solvent.

18. A method of manufacturing a carbon nanotube device according to claim 17, characterized in that the cross-linking agent also functions as a solvent.

19. A method of manufacturing a carbon nanotube device according to claim 1, characterized in that a base body having plasticity or flexibility is used as the base body.

* * * * *